United States Patent
Niino et al.

(10) Patent No.: US 6,849,123 B2
(45) Date of Patent: Feb. 1, 2005

(54) PLASMA PROCESSING METHOD AND METHOD FOR MANUFACTURING SEMICONDUCTOR DEVICE

(75) Inventors: Hiroaki Niino, Shizuoka (JP); Toshiyasu Shirasuna, Shizuoka (JP); Hitoshi Murayama, Shizuoka (JP); Makoto Aoki, Shizuoka (JP)

(73) Assignee: Canon Kabushiki Kaisha, Tokyo (JP)

( * ) Notice: Subject to any disclaimer, the term of this patent is extended or adjusted under 35 U.S.C. 154(b) by 195 days.

(21) Appl. No.: 10/195,398

(22) Filed: Jul. 16, 2002

(65) Prior Publication Data

US 2003/0143821 A1 Jul. 31, 2003

(30) Foreign Application Priority Data

Jul. 18, 2001 (JP) ........................................ 2001-218311

(51) Int. Cl.⁷ .............................................. C30B 25/10
(52) U.S. Cl. ......................... 117/104; 117/89; 117/90; 117/105; 117/106
(58) Field of Search ............................... 117/104, 105, 117/106, 89, 90

(56) References Cited

U.S. PATENT DOCUMENTS

| 4,579,618 | A | | 4/1986 | Celestino et al. ............ 156/345 |
| 5,534,070 | A | | 7/1996 | Okamura et al. ............ 118/723 |
| 5,562,952 | A | * | 10/1996 | Nakahigashi et al. ........ 427/534 |
| 5,569,502 | A | * | 10/1996 | Koinuma et al. ............ 427/600 |
| 5,698,062 | A | | 12/1997 | Sakamoto et al. ........... 156/345 |
| 5,891,252 | A | | 4/1999 | Yokogawa et al. .......... 118/723 |
| 6,001,521 | A | | 12/1999 | Hashizume et al. ........ 430/58.1 |
| 6,065,425 | A | * | 5/2000 | Takaki et al. ............. 118/723 E |
| 6,599,818 | B2 | * | 7/2003 | Dairiki ....................... 438/486 |
| 2002/0014625 | A1 | * | 2/2002 | Asami et al. ................. 257/57 |
| 2002/0056415 | A1 | * | 5/2002 | Mashima et al. ......... 118/723 E |

FOREIGN PATENT DOCUMENTS

| JP | 60-160620 | 8/1985 |
| JP | 62-188783 | 8/1987 |
| JP | 6-287760 | 10/1994 |
| JP | 7-74159 | 3/1995 |
| JP | 7-130719 | 5/1995 |
| JP | 9-321031 | 12/1997 |

* cited by examiner

*Primary Examiner*—Robert Kunemund
(74) *Attorney, Agent, or Firm*—Fitzpatrick, Cella, Harper & Scinto

(57) ABSTRACT

To plasma-process a substrate having a large area uniformly at a high process speed to form a deposition film with uniform thickness and quality and favorable characteristics. A first high frequency power (with a frequency f1 and a power P1) and a second high frequency power (with a frequency f2 and a power P2) supplied to an electrode from a first high frequency power supply and a second high frequency power supply, respectively, are set so that the frequencies are equal to or higher than 10 MHz and equal to or lower than 250 MHz, a ratio of the frequency f2 to the frequency f1 (f2/f1) is equal to or higher than 0.1 and equal to or lower than 0.9, and a ratio of the power P2 to a total power (P1+P2) is equal to or higher than 0.1 and equal to or lower than 0.9. The frequency f2 is changed during processing the substrate.

19 Claims, 5 Drawing Sheets

PLASMA PROCESSING METHOD AND METHOD FOR MANUFACTURING SEMICONDUCTOR DEVICE

BACKGROUND OF THE INVENTION

1. Field of the Invention

The present invention relates to a plasma processing method, a method for manufacturing a semiconductor device and a semiconductor device. Particularly, it relates to a method for manufacturing a semiconductor device based on a plasma CVD method, which can suitably provide a crystal or non-singlecrystal functional deposition film useful for a semiconductor device serving as an electrophotographic photosensitive member, a line sensor for image input, an image pickup device, a photovoltaic device or the like, and a semiconductor device manufactured according to the same method.

2. Related Background Art

As a vacuum process used to form a semiconductor device, an electrophotographic photosensitive member, a line sensor for image input, an image pickup device, a photovoltaic device, or other electronic or optical devices, many types of methods have been known, such as vacuum evaporation, sputtering, ion plating, plasma etching, and apparatus for the methods have been put into practical use.

For example, a plasma CVD method, which provides a thin deposition film formed on a substrate by using a direct-current or high-frequency glow discharge to decompose a source gas, has been put into practical use as a suitable measure for forming a deposition film. The plasma CVD method is used for forming a deposition film of amorphous silicon hydride (referred to as an a-Si: H, hereinafter), for example, and various kinds of apparatus used for the method have been proposed.

Such apparatus and method for forming a deposition film will be generally described below.

FIG. 5 is a diagram schematically showing an example of an apparatus for forming a deposition film based on the plasma CVD method (abbreviated as RF-PCVD, hereinafter) using a high frequency power of the RF band, specifically, an apparatus for forming an electrophotographic photosensitive member. The forming apparatus shown in FIG. 5 is arranged as described below.

The apparatus generally comprises a deposition unit 3100, a source gas supply unit 3200, and an exhaust unit (not shown) for reducing pressure in a reactor 3110. The reactor 3110 in the deposition unit 3100 has a cylindrical substrate 3112, a heater 3113 for heating the substrate and a source gas introducing pipe 3114 installed therein. A high frequency matching box 3115 is connected to an electrode 3111 which is part of the reactor 3110. The electrode 3111 is insulated from ground potential by an insulator 3120, and a high frequency voltage can be applied between the electrode and the cylindrical substrate 3112 which is kept at the ground potential and also serves as an anode electrode.

The source gas supply unit 3200 comprises gas cylinders 3221 to 3225 for containing a source gas, such as $SiH_4$, $H_2$, $CH_4$, $B_2H_6$ or $PH_3$, valves 3231 to 3235, 3241 to 3245 and 3251 to 3255, and mass flow controllers 3211 to 3215. The source gas cylinders are connected to the gas introducing pipe 3114 in the reactor 3110 via the valve 3260.

The apparatus can be used to form the deposition film as described below, for example.

First, the cylindrical substrate 3112 is installed in the reactor 3110, and gas in the reactor 3110 is exhausted by the exhaust unit (not shown, a vacuum pump, for example). Then, the temperature of the cylindrical substrate 3112 is controlled with the heater 3113 for heating the substrate to be kept at a predetermined temperature from 200 to 350 degrees Celsius.

In order to supply the source gas for forming the deposition film into the reactor 3110, it is first checked that the gas cylinder valves 3231 to 3235 and a leak valve 3117 of the rector container are closed, and that the inlet valves 3241 to 3245, the outlet valves 3251 to 3255 and the auxiliary valve 3260 are opened Then, a main valve 3118 is opened to exhaust gas from the reactor 3110 and a gas pipe 3116.

When a vacuum gage 3119 indicates about 0.1 Pa or lower, the auxiliary valve 3260 and the outlet valves 3251 to 3255 are closed.

Then, the valves 3231 to 3235 are opened for supplying the gasses from the gas cylinders 3221 to 3225, and the pressures of the gasses are controlled at 0.2 MPa by their respective pressure regulators 3261 to 3265. Then, the inlet valves 3241 to 3245 are gradually opened to supply the gasses to the mass flow controllers 3211 to 3215.

After the preparation for the film deposition has been completed in this way, layers are formed according to the following procedure.

When the temperature of the cylindrical substrate 3112 reaches a predetermined temperature, required one of the outlet valves 3251 to 3255 and the auxiliary valve 3260 are gradually opened to introduce a predetermined gas into the reactor 3110 from one of the gas cylinders 3221 to 3225 through the gas introducing pipe 3114. Then, the source gases are regulated to have a predetermined flow rate with the mass flow controllers 3211 to 3215. At the same time, opening of the main valve 3118 is adjusted with the aid of the vacuum gage 3119 so that the pressure in the reactor 3110 is at a predetermined value. When the internal pressure is stabilized, an RF power supply (not shown) with a frequency of 13.56 MHz is set at a predetermined power, and the RF power is introduced into the reactor 3110 through the high frequency matching box 3115 and the cathode 3111 to produce a glow discharge between the cathode and the cylindrical substrate 3112 serving as an anode. The source gas introduced into the reactor is decomposed by discharge energy, and a predetermined deposition film primarily made of silicon is formed on the cylindrical substrate 3112. After the deposition film having a predetermined thickness is formed, the supply of the RF power is stopped, the outlet valve is closed to stop the supply of the gas into the reactor, and thus, the forming of the deposition film is completed.

By repeating the same operation for several times, a desired multilayered photoreception layer can be formed.

It goes without saying that, when forming each layer, the outlet valves other than one for the gas required for the layer are closed. Furthermore, in order to prevent the respective gases from remaining in the reactor 3110 or pipes from the outlet valves 3251 to 3255 to the reactor 3110, the operation of exhausting gas in the system to a high vacuum state by closing the outlet valves 3251 to 3255, opening the auxiliary valve 3260 and fully opening the main valve 3118 is performed as required.

In addition, to assure uniform film formation, it is effective that the cylindrical substrate 3112 is rotated at a predetermined speed with a driving device (not shown) during forming the layer.

In addition, the gas species and the valve operations described above may be, of course, modified according to a condition for forming the respective layers.

Besides such an RF plasma CVD method, a plasma CVD method using a high frequency power in the VHF band (abbreviated as "VHF-PCVD", hereinafter) has attracted attention, and various developments of film deposition using the method have been actively made.

The VHF-PCVD method can provide a high film deposition speed and high-quality deposition film, and thus is expected to realize the cost reduction and quality improvement of the product at the same time. For example, in Japanese Patent Application Laid-Open No. 6-287760 (corresponding to U.S. Pat. No. 5,534,070), there are disclosed an apparatus and method for forming an a-Si film used as an electrophotographic photosensitive member. Besides, an apparatus for forming a deposition film that can form a plurality of photoreception members for electrophotography and has a high productivity as shown in FIGS. 6A and 6B has been developed.

FIG. 6A is a schematic longitudinal section of an apparatus for forming a deposition film, and FIG. 6B is a schematic cross-sectional view of the apparatus.

A reactor 4111 has an exhaust pipe 4112 integrally formed on its side, and the other end of the exhaust pipe 4112 is connected to an exhaust unit (not shown). Six cylindrical substrates 4113, on which a deposition film is to be formed, are arranged surrounding an electrode 4114. Each of the cylindrical substrates 4113 is held on a rotation shaft 4121 and adapted to be heated by a heat generator 4120. When a motor 4123 is driven, the rotation shaft 4121 is rotated by the motor via a reduction gear 4122, and the cylindrical substrate 4113 is rotated about a longitudinal center axis thereof.

A source gas is supplied to the reactor 4111 from source gas supply means 4118. The VHF power is supplied to the reactor 4111 from a VHF power supply 4116 through a matching box 4115 and then an electrode 4114. At this time, the cylindrical substrates 4113 kept at the ground potential via the rotation shafts 4121 each serve as an anode electrode.

Such an apparatus can be used to form a deposition film generally according to the following procedure.

First, the cylindrical substrates 4113 are installed in the reactor 4111, and gas in the reactor 4111 is exhausted through the exhaust pipe 4112 by the exhaust unit, not shown. Then, the cylindrical substrates 4113 are heated and controlled with the heat generator 4120 at a predetermined temperature from 200 to 300 degrees Celsius.

When the temperature of the cylindrical substrates 4113 reaches a predetermined temperature, a source gas is introduced into the reactor 4111 via the source gas supply means 4118. Once it is confirmed that the flow rate of the source gas is at a predetermined flow rate and the pressure in the reactor 4111 is stabilized, a predetermined VHF power is supplied to the electrode 4114 from the high frequency power supply 4116 through the matching box 4115. In this way, the VHF power is introduced into the reactor 4111, a glow discharge is produced in the reactor 4111, and thus, the source gas is excited and dissociated to form a deposition film on the cylindrical substrates 4113.

After the deposition film having a desired thickness is formed, the supply of the VHF power is stopped, and then the supply of the source gas is stopped to complete the forming of the deposition film. By repeating the same operation for several times, a desired multilayered photoreception layer can be formed.

During forming the deposition film, the cylindrical substrate 4113 is rotated at a predetermined speed with the motor 4123 via the rotation shaft 4121 to form the deposition film that is uniform over the whole surface of the cylindrical substrate.

In Japanese Patent Application Laid-Open No. 62-188783, there is disclosed a method for manufacturing an electrostatic latent image carrier, in which a modulation frequency power of a low frequency alternating current (20 Hz to 1 MHz) and a high frequency alternating current (1 MHz to 100 GHz) superimposed on each other is supplied to an electrode to form and stack amorphous semiconductor layers on a substrate, and thus, any heater is not required and the film deposition speed is improved.

In Japanese Patent Application Laid-Open No. 7-130719 (corresponding to U.S. Pat. No. 5,698,062), there is disclosed a technique of a plasma processing apparatus in which a synthesized high frequency power of at least two frequencies synthesized is applied to an electrode, and the ratio of the frequencies to be synthesized can be adjusted to change the composition ratio of reactive ions in a reactive gas plasma, whereby the precision of machining is enhanced.

In Japanese Patent Application Laid-Open No. 7-74159, there are disclosed plasma processing apparatus and method in which a high frequency power of 60 MHz and a low frequency power of 400 kHz are superimposed on each other to be supplied to an electrode on the side of a substrate, and a self-bias voltage is controlled by changing the value of the low frequency power, thereby increasing an etching rate and reducing particle generation.

The above-described methods and apparatus can realize good plasma processing and deposition film formation. However, the demands of the market on such products are being increased day by day, and there is a need for a method for plasma processing and deposition film formation that can produce a product with higher quality.

For example, in the case of an electrophotographic photosensitive member, there is a high demand for improvements in the process speed, miniaturization, cost reduction, etc., of electrophotographic apparatus. Consequently, it is desirable to enhance electrophotographic photosensitive member properties specifically reflecting such demands as improved chargeability and photosensitivity while increasing the percent of manufacturing non-defectives. In addition, in digital electrophotographic apparatus and color electrophotographic apparatus the widespread use of which is noticeable in recent years, copies are frequently taken not only of letters or documents, but also of photographs, pictures, design drawings, etc., hence reduced optical memory is increasingly demanded. Further, in order to lower unevenness in image density, it is required that a film uniform both in thickness and quality is formed on a large area substrate.

While aiming for such improvements in the properties of photosensitive members, optimizing layer forming conditions and layer constitution is being tried. Besides that, there is a need for making improvements in the process and apparatus for producing electrophotographic photosensitive members.

In such circumstances, there is room still left for improvements in the plasma processing method, and the process and apparatus for producing electrophotographic photosensitive members.

As described previously, by performing a vacuum processing by using a high frequency power with a frequency in or near the VHF band to produce plasma, a speed and characteristics of the vacuum processing can be improved. However, if a high frequency power in such a frequency band is used, the wavelength of the high frequency power in the vacuum processing container is substantially the same as the length of the vacuum processing container, high frequency power electrode, substrate, substrate holder or the like, and thus, a standing wave of the high frequency power is formed in the vacuum processing container. The standing wave causes spatial variations of intensity of electric power in the vacuum processing container, thereby varying plasma characteristics. As a result, while the thickness of the deposition film is substantially uniform in a plane of the substrate, the quality of the film is not uniform. In the case of a large-area substrate to be processed, such as the electrophotographic photosensitive member, the nonuniform quality of the film results in a characteristics unevenness, and it is difficult to provide uniform vacuum processing characteristics over a large area.

In the case of a thick device, such as the electrophotographic photosensitive member, a characteristics distribution of the substrate in a plane thereof varies according to the thickness since the state of plasma is changed in the course of film deposition. Accordingly, the film quality may become nonuniform, or be changed in the thickness direction.

Such an unevenness becomes a significant problem when forming a crystal or non-singlecrystal functional deposition film used for a photovoltaic device, line sensor for image input or image pickup device, as well as the electrophotographic photosensitive member. In addition, also in a plasma processing, such as dry etching or sputtering, when a discharge frequency is increased, the same processing unevenness appears, which would become a significant problem if no measures are taken.

In order to solve such a problem, it is considered that a plurality of different high frequency powers are simultaneously supplied into the reactor. This results in a plurality of standing waves with different wavelengths associated with the respective frequencies. Since high frequency powers are simultaneously supplied, a plurality of standing waves are synthesized, and no distinct standing waves are formed.

According to this consideration, whatever values a plurality of different high frequency powers have, they may exhibit an effect of suppressing the standing waves. For example, in Japanese Patent Application Laid-Open No. 60-160620 (corresponding to U.S. Pat. No. 4,579,618), there is disclosed a structure in which a high frequency power equal to or higher than 10 MHz and a high frequency power equal to or lower than 1 MHz are supplied to one and the same electrode. And in Japanese Patent Application Laid-Open No. 9-321031 (corresponding to U.S. Pat. No. 5,891,252), there is disclosed a structure in which a first high frequency power in the UHF band (equal to or higher than 300 MHz and equal to or lower than 1 GHz) and a second high frequency power with a frequency twice or more as high as that of the first high frequency power are superimposed on each other.

These techniques were expected to suppress the standing waves of the high frequency powers in the reactor and improve the vacuum processing uniformity.

However, in experiments concerning the uniformity carried out by the inventors with the above-described techniques, the uniformity of the vacuum processing characteristics was improved to a certain level, but the uniformity could not attain the level required recently. That is, it was proved that, even with a power supply method that should provide uniform electric field intensity, a certain level of unevenness remains in a practical vacuum processing.

SUMMARY OF THE INVENTION

A first object of this invention is to overcome the disadvantages of the prior art as described above and to provide a plasma processing method that allows a substrate with a large area to be uniformly plasma-processed at a speed not possible with a conventional plasma process.

A second object of this invention is to provide a method for forming a deposition film based on the plasma CVD, the method capable of forming at a high speed a deposition film having uniform thickness and quality in the in-plane direction of the substrate and favorable characteristics.

A third object of this invention is to provide a method for manufacturing a semiconductor device on a cylindrical or planar substrate, the semiconductor device having uniform thickness and quality in any directions in the substrate and superior characteristics.

A fourth object of this invention is to provide a semiconductor device formed on a cylindrical or planar substrate, the semiconductor device having uniform thickness and quality in any directions in the substrate and superior characteristics.

Specifically, the present invention provides a plasma processing method comprising installing an object in a reactor which can be evacuated, introducing a gas into the reactor, decomposing the introduced gas with a plurality of high frequency powers applied to an electrode to produce plasma, and processing the object with the plasma, wherein the plurality of the high frequency powers are different in frequency from each other, and the frequency of at least one of the high frequency powers is changed during the processing step.

In addition, the present invention provides a method for manufacturing a semiconductor device, comprising installing an object in a reactor which can be evacuated, introducing a gas into the reactor, decomposing the introduced gas with a plurality of high frequency powers applied to an electrode to produce plasma, and processing the object with the plasma, wherein the plurality of the high frequency powers are different in frequency from each other, and the frequency of at least one of the high frequency powers is changed during the processing step.

Further, the present invention provides a process for producing a semiconductor device having a plurality of layers and a substrate, comprising installing the substrate in a reactor which can be evacuated, introducing a gas into the reactor, decomposing the introduced gas with a plurality of high frequency powers applied to an electrode to generate a glow discharge, and depositing at least one layer at the substrate, wherein the plurality of the high frequency powers are different in frequency from each other, and the frequency of at least one of the high frequency powers is changed during the depositing step.

Furthermore, the present invention provides a process for producing a semiconductor device having a plurality of layers and a substrate, comprising installing the substrate in a reactor which can be evacuated, introducing a gas into the reactor, decomposing the introduced gas with a plurality of high frequency powers having frequencies f1 and f2 applied to an electrode to generate a glow discharge, depositing a first layer at the substrate, introducing another gas into the reactor, decomposing the introducing gas with a plurality of high frequency powers having frequencies f3 and f4 applied to the electrode to generate a glow discharge, and depositing a second layer at the substrate, wherein at least one of the high frequency powers is different in frequency between when depositing the first layer and when depositing the second layer.

DETAILED DESCRIPTION OF THE PREFERRED EMBODIMENTS

Figure 1:
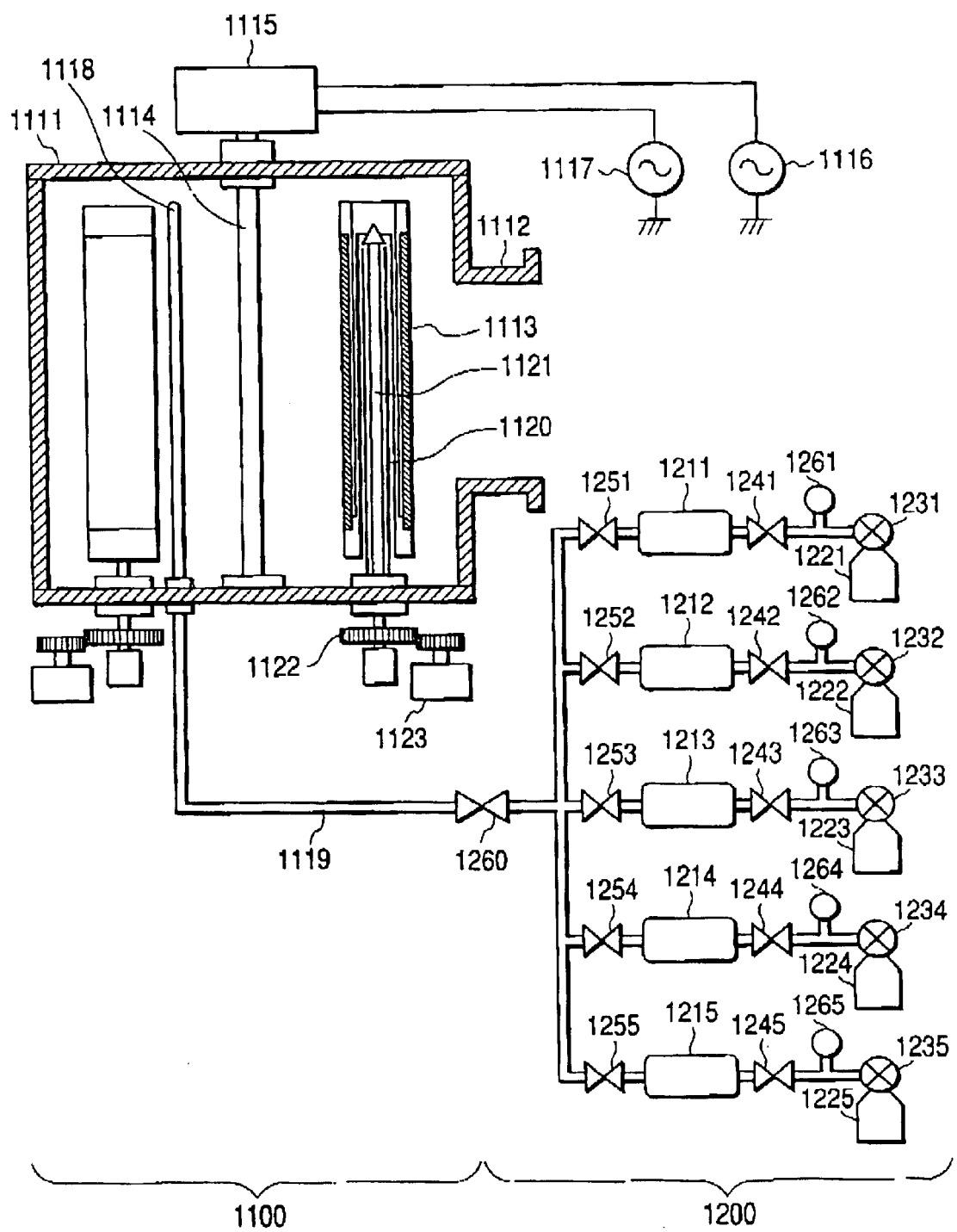
FIG. 1 is a diagram schematically showing an apparatus for manufacturing an electrophotographic photosensitive member based on a plasma CVD method, which is an example of a vacuum processing apparatus according to this invention.

As a result of earnest investigation on the problems of the conventional apparatus and method described above, the inventors have found that in the VHF band and at a high frequency in the vicinity thereof, a plasma distribution is sensitive to an electrode size or discharge conditions, an effect of a standing wave occurs since a wavelength of a high frequency power in a vacuum processing container becomes substantially the same as the length of the vacuum processing container, high frequency electrode, substrate, substrate holder or the like, and plasma distribution characteristics tends to be nonuniform, resulting in processing unevenness.

In addition, in the case of a plasma generated with a VHF band high frequency power, a problem of a surface impedance of the electrode due to the skin effect becomes noticeable. That is, at a high frequency such as in the VHF band, a high frequency current flows only through the vicinity of the surface of a conductor, so that a Joule loss at the electrode surface is increased, power efficiency is reduced, and a plasma density becomes uneven due to variations in a propagation path length. In addition, the surface impedance of the electrode depends on roughness, contamination or the like of the electrode surface, and it is difficult to attain an uniform surface impedance. The unevenness of the plasma density as described above leads to an unevenness of the surface processing.

To reduce such a processing unevenness, various improvements in the shape of the electrode, introduction of the high frequency power or the like have been made. However, it has not been easy to assure the compatibility between the uniformity of film thickness and the uniformity of film quality and to provide a deposition film with a good quality while maintaining the uniformity.

In particular, in the case where the uniformity is to be attained by improvement in terms of device, for example, improvement in the shape of the electrode, if a laminated device has a plurality of layer regions, one method, which is effective for a particular layer region, may not be sufficiently effective for the other layer regions. Thus, there has been needed a simple and effective method to assure the uniformity in the case where there are a plurality of layer regions formed under different conditions.

For example, in the case of the frequencies specifically described in the above-described Japanese Patent Application Laid-Open No. 60-160620 (corresponding to U.S. Pat. No. 4,579,618), that is, in the case where a high frequency power of 10 MHz or higher (referred to as a "higher frequency power", hereinafter) and a high frequency power of 1 MHz or lower (referred to as a "lower frequency power", hereinafter) are supplied simultaneously to the processing container, a standing wave of an electric field of the higher frequency power and a standing wave of an electric field of the lower frequency power are synthesized, and thus, the standing wave of the electric field of the higher frequency power in the processing container can be suppressed. However, when the frequencies of the higher frequency power and lower frequency power differ from each other by one digit or more, the decomposition of the source gas is performed in different manners, and types and ratios of active species generated vary. Therefore, although the uniform electric field intensity can be attained, types and ratios of active species produced at an antinode of the standing wave of the higher frequency power produces active species are associated with the frequency, and types and ratios of active species produced at an antinode of the standing wave of the lower frequency power differ from those produced at an antinode of the standing wave of the higher frequency power. As a result, types and ratios of active species have a spatial distribution, which results in the unevenness of the vacuum processing characteristic.

Upon investigation concerning a method for solving these problems and attaining uniform plasma generation and uniform plasma processing based thereon, it has been experimentally proved that the uniformity of the film thickness and the uniformity of the film quality in a plane of the substrate can be significantly enhanced by applying to one and the same electrode two kinds of high frequency power whose frequencies are close to each other, and appropriately setting the frequencies and power ratio of the high frequency powers.

Figure 6A:
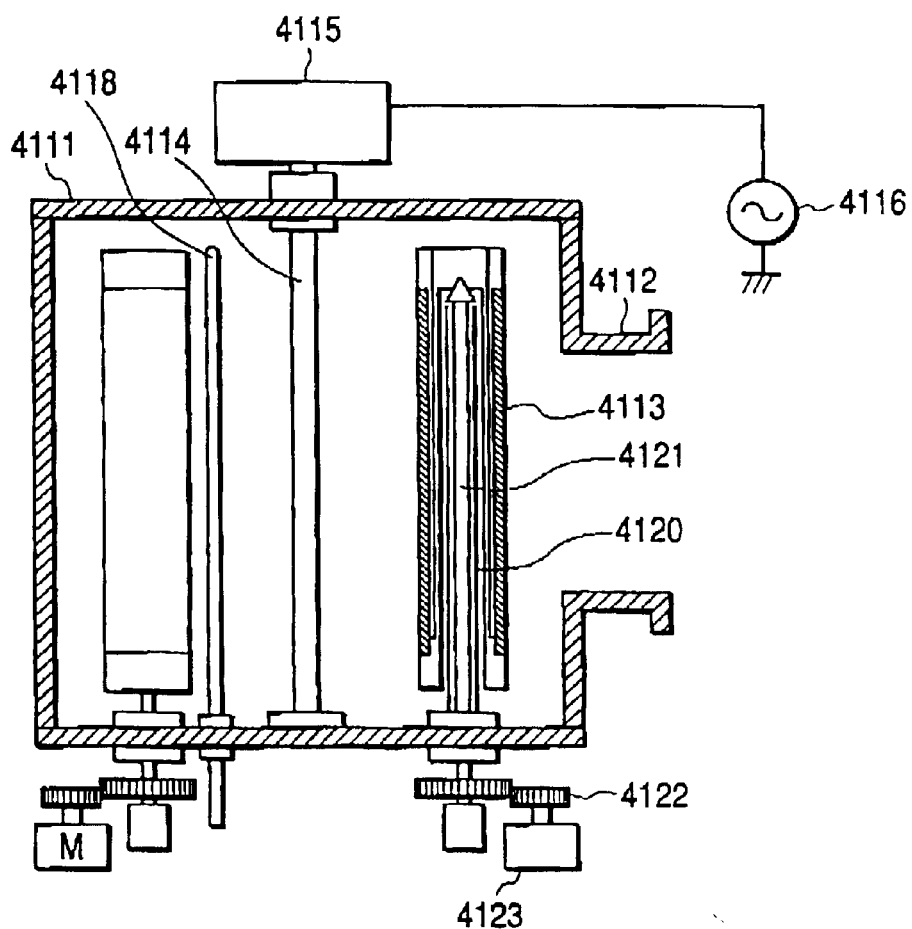
FIGS. 6A and 6B are a diagram schematically showing an example of a conventional apparatus for forming an electrophotographic photosensitive member based on the plasma CVD method using the VHF frequency band.
Figure 6B:
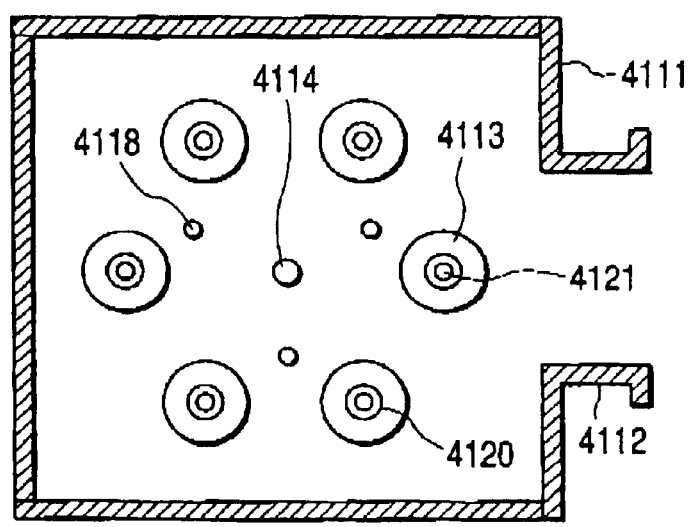

With an apparatus shown in FIGS. 6A and 6B, a high frequency power output from a high frequency power supply was applied to an electrode through a matching circuit to generate plasma by the action of a high frequency electric field between the electrode and a substrate to be processed opposite to the electrode, thereby subjecting the substrate to be processed to plasma processing (deposition of the a-Si film).

In the case of the apparatus shown in FIGS. 6A and 6B, a substrate of an electrophotographic photosensitive member, which is the substrate to be processed, has a length of about 350 mm, and thus, the electrode necessarily has a length of about 350 to 400 mm.

If the frequency of the high frequency power supplied to the electrode is set at 13.56 MHz to 100 MHz, for example, the wavelength $\lambda$ thereof is about 22 m to 3 m in the atmosphere. The high frequency power supplied to one end of the electrode propagates through the surface of the electrode to the other side. If the propagation length is equal to or more than $\lambda/10$, a distribution in the electric field occurs on the electrode due to the effect of the standing wave. That is, at 100 MHz, an electric field unevenness occurred in the discharge space due to the effect of the high frequency electric field, an unevenness in the plasma characteristics was found in the axial direction, and accordingly, an unevenness was found in the characteristics of the deposition film.

Thus, to eliminate the unevenness due to the unevenness of the high frequency electric field on the electrode and prevent the high frequency standing wave from being reflected on the unevenness of the plasma characteristics, two kinds of high frequency power whose frequencies are different but relatively close to each other were supplied simultaneously to the electrode. Then, local unevennesses that would otherwise occur at the respective frequencies were reduced, and as a result, a deposition film having a uniform thickness and quality was obtained substantially over the whole substrate.

In addition, it was confirmed that, since a film is deposited on an inner wall of the reactor and the surface of the electrode as the deposition film is formed on the substrate, optimal conditions for maintaining the uniformity of the plasma is changed with the progress of the processing, and in particular, in the case of a device having a thick deposition film such as the electrophotographic photosensitive member, the characteristics distribution in the in-plane direction of the substrate varies according to the thickness of the film deposited.

It was also confirmed that, in the case of the laminated device having a plurality of layer regions, the layer regions have different compositions, film structures and the like for the respective required functions, and optimal conditions for the frequencies and powers of the high frequency powers for attaining both of the uniformity and the good film quality depend on each of the layer regions.

For example, in the case of the electrophotographic photosensitive member, typically, a photoconductive layer is made of amorphous silicon (a-Si), and a surface layer is made of amorphous silicon carbide (a-SiC) in consideration of hardness and light transmission properties. In this case, if the frequencies and power ratio optimized to form the a-Si layer are used to form the a-SiC layer continuously, a sufficient uniformity of the composition (the ratio of Si and C) is not attained, although the thickness uniformity is attained. As a result, a sensitivity unevenness or chipping unevenness may occur. In addition, since a-Si and a-SiC have different structures, if forming conditions optimized for a-Si is used to form a-SiC, poor cleaning or melt-adhesion is liable to occur.

Furthermore, when the composition of a layer region is changed, the same problem as described above may arise because the optimal conditions depend on the composition.

Thus, in order to adjust the high frequency power distribution on the electrode surface, investigation was made concerning the uniformity of the thickness and quality of various deposition films formed by varying the frequencies and power ratios of the high frequency powers, for example, concerning the uniformity of a dark conductivity and bright conductivity. As a result, it was found that a deposition film which is uniform in the thickness direction can be relatively readily provided by changing the frequencies of the high frequency powers while forming the deposition film. In addition, it was found that a more uniform deposition film can be provided by changing the power ratio of the high frequency powers in addition to the frequencies.

In addition, it was found that, even when deposition films different in composition, for example, the a-Si film and the a-SiC film, are formed into a stack, in spite of their different compositions, deposition films having uniform thickness and quality and suitable structure can be provided by changing the frequencies and power ratios according to the compositions of the respective deposition films.

Thus, a device with uniform and preferable characteristics can be provided by changing the frequencies and power ratios of the high frequency powers supplied to the electrode with the passage of the plasma processing or according to the composition of the film.

In the present invention, it is essential that two kinds of high frequency power are supplied into the vacuum processing container through one and the same electrode. If the high frequency powers with different frequencies are supplied from separate electrodes, the electrodes produce standing waves depending on the frequencies of the high frequency powers, respectively. As a result, the plasma characteristics in the vicinity of the electrodes have distributions depending on the respective standing waves, and thus, kinds and ratios of the generated active species and energy of ions vary in dependence on locations.

According to this invention, the relationship between two kinds of high frequency power supplied to the electrode, that is, the frequencies and power ratios thereof may be determined by actually checking the uniformity of the vacuum processing. However, it is essential that the ratio of a frequency f2 to a frequency f1 (f2/f1) is kept to be 0.1 or more and 0.9 or less, where f1 denotes the frequency of the high frequency power with the higher frequency of the two high frequency powers, and f2 denotes the frequency of the high frequency power with the lower frequency.

If the difference between the frequencies f1 and f2 is too small, it is substantially the same as the case where the high frequency powers having the same frequency are applied, the positions of the nodes and antinodes of the respective standing waves are close to each other, and thus, the effect of suppressing the standing waves becomes insufficient. If the difference is too large, the difference in kinds and ratios of the generated active species due to the frequency difference becomes significant. Therefore, it is essential to keep the ratio f2/f1 in the relation described above.

To obtain the advantages of this invention, it is essential that the high frequency power supplied to the electrode includes at least two kinds of high frequency power each having a frequency equal to or higher than 10 MHz and equal to or lower than 250 MHz.

If the frequency f2 becomes lower than 10 MHz, it becomes difficult to provide a high processing speed. In terms of deposition speed, the frequency is preferably set at 30 MHz or higher.

On the other hand, if the frequency f1 becomes higher than 250 MHz, the attenuation of the power in the propagating direction becomes significant. Thus, a difference in attenuation between the high frequency powers having different frequencies also becomes significant, and the uniformity of the processing becomes insufficient.

For the reasons described above, the vacuum processing characteristics and the uniformity of the vacuum processing can be enhanced while keeping high the speed of the vacuum processing by maintaining the following conditions:

$$10 \text{ MHz} \leq f2 < f1 \leq 250 \text{ MHz} \tag{A};$$

and $$0.1 \leq f2/f1 \leq 0.9 \tag{B}.$$

As for the power ratio of the high frequency powers supplied to the electrode, in order to obtain the advantages of this invention, it is preferred that the ratio of a power P2 to a sum of powers (P1+P2) falls within a range of 0.1 or more and 0.9 or less, where powers associated with the above-described frequencies f1 and f2 are referred to as first and second high frequency powers P1 and P2, respectively. The relationship is expressed by:

$$0.1 \leq P1/(P1+P2) \leq 0.9 \tag{C}.$$

If the ratio of the second high frequency power P2 to the power sum is below the range, the first high frequency power P1 becomes a dominant factor of the high frequency electric field, and the effect of suppressing the standing waves is not attained on the other hand, as the second high frequency power P2 is increased, the influence of the second high frequency power P2 on the source gas in the reactor is also increased. Then, the situation becomes similar to the case that only the second high frequency power P2 is used, where the effect of suppressing the standing waves is reduced.

As described above, the advantages of this invention can be sufficiently obtained when two kinds of high frequency powers are combined with each other. However, a third high frequency power may be further combined with the high frequency powers. While the range of the third high frequency power is not particularly restricted as far as the first and second high frequency powers are set within an appropriate range, the third high frequency power may be set as follows.

If the third high frequency power (with a frequency f3 and power P3) falls within the range of 10 MHz or more and 250 MHz or less as in the frequencies f1 and f2, the same mechanism as the case where the first high frequency power (P1, f1) and the second high frequency power (P2, f2) are combined with each other can be expected. Here, if the top two of the powers P1 to P3 in terms of power value are redefined as P1 and P2, the power P3 has the lowest power value. In this case, mismatching due to the power P3 is hard to occur and the effect of suppressing the standing waves due to the power P3 is added, and the unevenness may be further reduced as compared with the case where only the powers P1 and P2 are combined with each other.

In the case where the frequency f3 is set beyond the range from 10 MHz to 250 MHz in order to attain a bias effect or the like, for example, there is no problem as far as the frequencies f1 and f2 and the powers P1 and P2 are appropriately set within the range according to this invention. In this way, when another kind of power is supplied to the electrode, it is necessary that supplying the power does not impair the uniformity of the vacuum processing According to this invention, the number of kinds of high frequency power with different frequencies is not limited to three, and four or five kinds of high frequency power may be supplied, for example.

This invention can also be applied to formation of a deposition film of a material other than the above-described a-Si or a-SiC, etching of polysilicon or the like, or surface reforming such as surface oxidation or surface nitrding. For example, if the method of this invention is applied to etching, the uniform plasma provides uniform etching. Thus, high-quality etching can be realized without removing a substrate material and leaving a material to be etched.

The constitution of this invention is more effective for electrophotographic photosensitive members and the manufacture thereof. In the case of the electrophotographic photosensitive member, it is required that a deposition film is formed on a substrate with a large area and no structural fault exist over the whole area. Since, according to this invention, a deposition film with favorable characteristics and uniform thickness and quality can be formed on a substrate, this invention is quite advantageous in that the device characteristics is improved and the cost is reduced due to the enhancement of the productivity.

Furthermore, the constitution of this invention is quite effective for not only electrophotographic photosensitive members but also large substrates for photovoltaic devices. However, even if the substrate is not large, it is greatly effective when a high frequency power with a short wavelength relative to an electrode length is used.

Now, embodiments of this invention will be described with reference to drawings.

(First Embodiment)

FIG. 1 is a schematic diagram showing a first embodiment of a plasma processing apparatus according to this invention.

The plasma processing apparatus of this embodiment is an apparatus for forming a deposition film on a cylindrical substrate, and generally comprises a deposition unit 1100, a source gas supply unit 1200, and an exhaust unit (not shown) for reducing pressure in a reactor 1111. The reactor 1111 has an exhaust pipe 1112 integrally formed on the side surface thereof, and the other end of the exhaust pipe 1112 is connected to the exhaust unit, not shown. Six cylindrical substrates 1113, on which a deposition film is to be formed, are so arranged as to surround an electrode 1114 disposed at the center of the reactor 1111. Each of the cylindrical substrates 1113 is held on a rotation shaft 1121 and heated by a heat generator 1120. When a motor 1123 is driven, the rotation shaft 1121 is rotated by the motor via a reduction gear 1122, and the cylindrical substrate 1113 is rotated around its longitudinal center axis.

The source gas supply unit 1200 comprises gas cylinders 1221 to 1225 for containing a source gas, such as $SiH_4$, $H_2$, $CH_4$, $B_2H_6$ or $PH_3$, valves 1231 to 1235, 1241 to 1245 and 1251 to 1255, and mass flow controllers 1211 to 1215. The source gas cylinders are connected to a gas introducing pipe 1118 in the reactor 1111 via a valve 1260.

The high frequency powers from a first high frequency power supply 1116 and a second high frequency power supply 1117, which are two high frequency power supplies with different frequencies, for example, are synthesized in a matching box 1115 through their respective matching circuits and supplied Into the reactor 1111 through the electrode 1114.

In this embodiment, the relation among a plurality of high frequency powers supplied to the electrode, that is, the frequencies and power ratios may be determined by actually checking the uniformity of the vacuum processing. However, it is essential that the ratio of a frequency f2 to a frequency f1 (f2/f1) is kept to be 0.1 or more and 0.9 or less, where f1 denotes the frequency of the higher frequency power between the high frequency power from the first high frequency power supply 1116 and the high frequency power from the second high frequency power supply 1117 and f2 denotes frequency of the lower frequency power.

If the difference between the frequencies f1 and f2 is too small, it is substantially the same as the case where the high frequency powers having the same frequency are applied, the positions of the nodes and antinodes of the respective standing waves are close to each other, and the effect of suppressing the standing waves becomes insufficient. If the difference is too large, differences in kinds and ratios of the generated active species due to the frequency difference become significant. Therefore, it is essential to keep the ratio f2/f1 in the relation described above.

In this embodiment, to obtain the advantages of this invention, it is essential that the high frequency power supplied to the electrode includes at least two kinds of high frequency power each having a frequency equal to or higher than 10 MHz and equal to or lower than 250 MHz.

If the frequency f2 becomes lower than 10 MHz, it becomes difficult to provide a high processing speed. In terms of deposition speed, the frequency is preferably set at 30 MHz or higher.

On the other hand, if the frequency f1 becomes higher than 250 MHz, the attenuation of the power in the propagating direction becomes significant. Thus, a difference in attenuation between the high frequency powers having different frequencies also becomes significant, and the uniformity of the processing becomes insufficient.

For the reason described above, the vacuum processing characteristics and the uniformity of the vacuum processing can be enhanced while keeping high the speed of the vacuum processing by maintaining the following conditions:

$$10 \text{ MHz} \leq f2 < f1 \leq 250 \text{ MHz};$$

and $$0.1 \leq f2/f1 \leq 0.9.$$

As for the power ratio of the high frequency powers supplied to the electrode 1114, in order to obtain the advantages of this invention, it is preferred that the ratio of a power P2 to a sum of powers (P1+P2) falls within a range of 0.1 or more and 0.9 or less, where powers associated with the above-described frequencies f1 and f2 are referred to as first and second high frequency powers P1 and P2, respectively.

If the ratio of the second high frequency power P2 to the power sum is below the range, the first high frequency power P1 becomes a dominant factor of the high frequency electric field, and the effect of suppressing the standing waves is not attained.

On the other hand, as the second high frequency power P2 is increased, the influence of the second high frequency power P2 on the decomposition of the source gas in the reactor is also increased. Then, the situation becomes similar to the case that only the second high frequency power P2 is used, where the effect of suppressing the standing waves is reduced.

In this embodiment, two power supplies are used to output high frequency powers with different frequencies. However, in this invention, it is necessary that two or more kinds of high frequency power different in frequency can be supplied, and three or more high frequency power supplies may be provided. That is, as described above, the advantages of this invention can be sufficiently obtained when two kinds of high frequency power are combined with each other. However, a third high frequency power may be further combined with the high frequency powers. While the range of the third high frequency power is not particularly restricted as far as the first and second high frequency powers are set within an appropriate range, the third high frequency power may be set as follows.

If the third high frequency power (with a frequency f3 and power P3) falls within the range of 10 MHz or more and 250 MHz or less as in the frequencies f1 and f2, the same mechanism as the case where the first high frequency power (P1, f1) and the second high frequency power (P2, f2) are combined with each other can be expected. Here, if the top two of the powers P1 to P3 in terms of power value are redefined as P1 and P2, the power P3 has the lowest power value. In this case, mismatching due to the power P3 is hard to occur and the effect of suppressing the standing waves due to the power P3 is added, and unevenness may be further reduced as compared with the case where only the powers P1 and P2 are combined with each other.

In the case where the frequency f3 is set beyond the range from 10 MHz to 250 MHz in order to attain a bias effect or the like, for example, there is no problem as far as the frequencies f1 and f2 and the powers P1 and P2 are appropriately set within the range according to this invention. In this way, when another kind of power is to be supplied to the electrode, it is necessary that supplying the power does not impair the uniformity of the vacuum processing.

In addition, if a power supply capable of outputting a high frequency power having a plurality of frequencies previously synthesized is used, one power supply may be provided. In any case, it is necessary that at least two kinds of high frequency power different in frequency can be supplied to one and the same electrode.

The shape of the electrode 1114 is not particularly limited. However, in order to attain significant uniformity of the vacuum processing, it is preferred that the electrode has the shape of a bar as shown in FIG. 1. Further, it is effective that plural electrodes are provided in accordance with the size of the vacuum processing space.

The surface of the electrode 1114 is desirably roughened to enhance the adhesion of the film so that the film is prevented from peeling off, and specifically, the ten-point mean roughness (Rz) with the reference length of 2.5 mm preferably falls within a range of 5 $\mu$m to 200 $\mu$m.

Furthermore, the surface of the electrode 1114 may be effectively coated with a ceramic material. The measure of the coating is not particularly limited, and the surface of the electrode 1114 may be coated by the CVD method, for example, thermal spraying or the like. However, thermal spraying is preferred in terms of cost and fewer restrictions due to the size and shape of an object to be coated.

The ceramic material may be alumina, titanium dioxide, aluminum nitride, boron nitride, zircon, cordierite, zircon-cordierite, silicon oxide, beryllium-oxide-mica-based ceramic or the like.

The thickness of the ceramic material is not particularly restricted. However, in terms of durability, uniformity, an amount of the absorption of the high frequency power and the production cost, it is preferably 1 $\mu$m to 10 mm thick, and it is more preferably 10 $\mu$m to 5 mm thick.

In addition, heating or cooling means may be provided on the electrode 1114 to further enhance the adhesion of the film to the surface of the electrode 1114 and prevent the peeling of the film more effectively. In this case, whether the electrode 1114 is heated or cooled is appropriately determined according to the material of the film to be deposited and the deposition condition. The heating means is not particularly limited as far as it is a heat generator. Specifically, it may be an electric resistance heat generator, such as a sheath-like wound heater, a plate-like heater and a ceramic heater, a heat radiating lamp, such as a halogen lamp and an infrared lamp, or a heat generator with heat exchanger means having a medium such as a liquid or gas. The cooling means is not particularly limited as far as it is a heat absorbing body. For example, it may be a cooling coil, cooling plate or cooling dome having a cooling medium such as a liquid or gas.

Generally, such an apparatus can be used to form a deposition film for a cylindrical electrophotographic photosensitive member according to the following procedure, for example.

First, the cylindrical substrates 1113 are installed in the reactor 1111, and gas in the reactor 1111 is exhausted through the exhaust pipe 1112 by the exhaust unit, not shown in the figure. Then, the cylindrical substrates 1113 are heated and controlled with the heat generator 1120 at a predetermined temperature from about 200 to 300 degrees Celsius.

When the temperature of the cylindrical substrates 1113 reaches a predetermined temperature, a source gas is introduced into the reactor 1111 via the source gas supply means 1118. Once it is confirmed that the flow rate of the source gas is at a predetermined flow rate and the pressure in the reactor 1111 is stabilized, a predetermined high frequency power is supplied to the electrode 1114 from the first and second high frequency power supplies 1116 and 1117, whose frequencies are different, through the matching box 1115. In this way, a glow discharge is produced in the reactor 1111, and thus, the source gas is excited and dissociated to form a deposition film on the cylindrical substrates 1113.

After a layer region having a desired thickness is formed, the source gases and the flow rates thereof are changed to predetermined kinds and values, respectively, and the frequency ratio of the high frequency powers are changed to form the next layer region.

When a desired layer constitution is formed, the supply of the power is stopped, and then the supply of the source gas is stopped. In this way, a multilayered electrophotographic photosensitive member is formed.

During forming the deposition film, the cylindrical substrate 1113 is rotated at a predetermined speed with the motor 1123 and the reduction gear 1122 via the rotation shaft 1121 to form the deposition film that is uniform over the whole surface of the cylindrical substrate.

(Second Embodiment)

Figure 2:
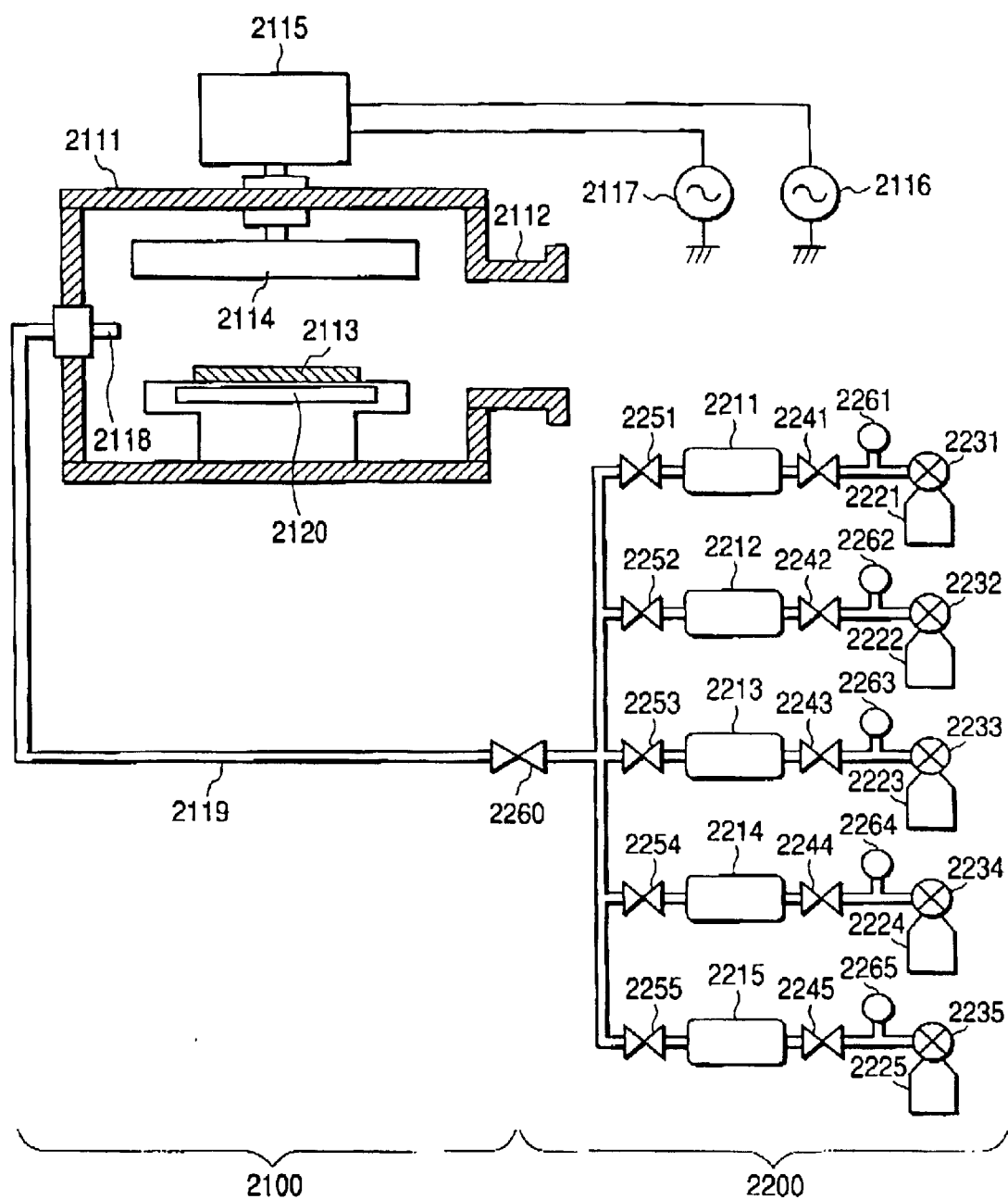
FIG. 2 is a diagram schematically showing a parallel plate plasma processing apparatus based on the plasma CVD method, which is an example of a vacuum processing apparatus according to this invention.

FIG. 2 is a schematic diagram showing a second embodiment of a plasma processing apparatus according to this invention.

The plasma processing apparatus of this embodiment is an apparatus for forming a deposition film on a planer substrate, and generally comprises a deposition unit 2100, a source gas supply unit 2200, and an exhaust unit (not shown) for reducing pressure in a reactor 2111. The reactor 2111 has an exhaust pipe 2112 integrally formed on its side surface, and the other end of the exhaust pipe 2112 is connected to the exhaust unit, not shown. A planar substrate 2113, on which a deposition film is to be formed, is disposed in the reactor 2111. The planar substrate 2113 is held on a substrate stage and is adapted to be heated by a heat generator 2120 incorporated with the substrate stage.

The source gas supply unit 2200 comprises gas cylinders 2221 to 2225 for containing a source gas, such as $SiH_4$, $H_2$, $CH_4$, $B_2H_6$ or $PH_3$, valves 2231 to 2235, 2241 to 2245 and 2251 to 2255, and mass flow controllers 2211 to 2215. The source gas cylinders are connected to the gas introducing pipe 2118 in the reactor 2111 via the valve 2260.

The high frequency powers from a first high frequency power supply 2116 and a second high frequency power supply 2117, which are two high frequency power supplies with different frequencies, are synthesized in a matching box 2115 through their respective matching circuits and supplied into the reactor 2111 through the electrode 2114.

In this embodiment, the relation among the plurality of high frequency powers supplied to the electrode, that is, the frequencies and power ratio thereof may be determined by actually checking the uniformity of the vacuum processing. However, the first and second high frequency power supplies 2116 and 2117 are related with each other as described in the first embodiment. That is, it is essential that the ratio of a frequency f2 to a frequency f1 (f2/f1) is kept to be equal to or more than 0.1 and equal to or less than 0.9, where f1 denotes the higher of the frequencies of the high frequency powers and f2 denotes the lower of the frequencies. In addition, as for the frequency bands thereof, the bands described in the first embodiment is preferably used. That is, the vacuum processing characteristics and the uniformity of the vacuum processing can be enhanced while keeping high the speed of the vacuum processing by maintaining the following conditions:

10 MHz≦f2<f1≦250 MHz;

and 0.1≦f2/f1≦0.9.

Furthermore, as for the power ratio of the high frequency powers supplied to the electrode 2114, as described in the first embodiment, in order to obtain the advantage of this invention, it is preferred that the ratio of a power P2 to a sum of powers (P1+P2) falls within a range of 0.1 or more and 0.9 or less, where powers associated with the above-described frequencies f1 and f2 are referred to as first and second high frequency powers P1 and P2, respectively.

Also in this embodiment, two power supplies are used to output high frequency powers with different frequencies. However, according to this invention, only needed is that two or more high frequency powers with different frequencies can be supplied, and three or more high frequency power supplies may be provided. Besides, if a power supply capable of outputting a high frequency power having a plurality of frequencies previously synthesized is used, one power supply may be provided. In any case, only needed is that at least two high frequency powers with different frequencies can be supplied to one and the same electrode.

The electrode 2114 may have a shape of a plate (rectangular or circular) or bar. In the case of a bar shape, a plurality of electrodes may be disposed depending on the size of the substrate.

The surface of the electrode 2114 is desirably roughened to enhance the adhesion of the film and to prevent the peeling thereof, and specifically, the ten-point average roughness (Rz) with the reference length of 2.5 mm preferably falls within a range of 5 μm to 200 μm.

Furthermore, the surface of the electrode 2114 may be effectively coated with a ceramic material. The measure of the coating is not particularly limited, and the surface of the electrode 2114 may be coated by the CVD method, thermal spraying or the like, for example. However, the thermal spraying is preferred in terms of cost and because it is less restricted by the size and shape of the object to be coated.

The ceramic material may be alumina, titanium dioxide, aluminum nitride, boron nitride, zircon, cordierite, zircon-cordierite, silicon oxide, beryllium-oxide-mica-based ceramic or the like.

The thickness of the ceramic material is not particularly restricted. However, in terms of durability, uniformity, an amount of the absorption of the high frequency power and the production cost, it is preferably 1 μm to 10 mm thick, and it is more preferably 10 μm to 5 mm thick.

In addition, heating or cooling means may be provided on the electrode 2114 to further enhance the adhesion of the film to the surface of the electrode 2114 and prevent the peeling of the film more effectively. In this case, whether the electrode 2114 is heated or cooled is appropriately determined according to the material of the film to be deposited and the deposition condition. The heating means is not particularly limited as far as it is a heat generator. Specifically, it may be an electric resistance heat generator, such as a sheath-like wound heater, a plate-like heater and a ceramic heater, a heat radiating lamps such as a halogen lamp and an infrared lamp, or a heat generator with heat exchanger means having a medium such as a liquid or gas. The cooling means is not particularly limited as far as it is a heat absorbing body. For example, it may be a cooling coil, cooling plate or cooling dome having a cooling medium such as a liquid or gas.

Generally, such an apparatus can be used to perform plasma processing or to form a deposition film for a photovoltaic device, for example, on the planar substrate according to the following procedure.

First, the planar substrate 2113 are installed in the reactor 2111, and gas in the reactor 2111 is exhausted through the exhaust pipe 2112 by the exhaust unit, not shown in the figure. Then, the substrate 2113 are heated and controlled with the heat generator 2120 at a predetermined temperature from 200 to 300 degrees Celsius.

When the temperature of the substrate 2113 reaches a predetermined temperature, a source gas is introduced into the reactor 2111 via the source gas supply means 2118. Once it is confirmed that the flow rate of the source gas is at a predetermined flow rate and the pressure in the reactor 2111 is stabilized, a predetermined high frequency power is supplied to the electrode 2114 from the first and second high frequency power supplies 2116 and 2117, which are two high frequency power supplies with different frequencies, through the matching box 2115. In this way, a glow discharge is produced in the reactor 2111, and thus, the source gas is excited and dissociated to form a deposition film on the substrate 2113.

After a layer region having a desired thickness is formed, the source gases and the flow rates thereof are changed to predetermined kinds and values, respectively, and the frequency ratio of the high frequency powers are changed to form the next deposition film.

When a desired layer constitution is formed, the supply of the high frequency power is stopped, and then the supply of the source gas is stopped. In this way, a multilayered photovoltaic device is formed.

While the apparatus according to the above-described embodiments have been described concerning the deposition film formation, the apparatus can be applied to plasma processings including etching, as well as the deposition film formation.

Not only during the formation of the multilayered device, but also during the formation of a single layer region or plasma processing such as etching, the frequency ratio of the high frequency powers can be effectively changed. Also in this case, it is essential that the above-described relations of the frequencies and power ratio are satisfied.

Figure 3A:
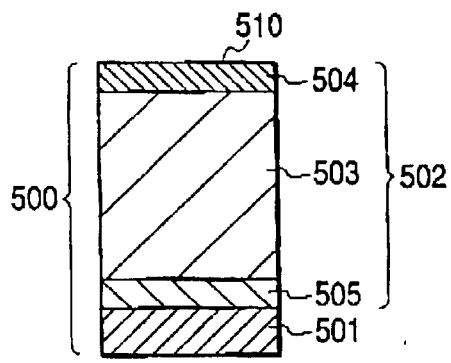
FIGS. 3A, 3B and 3C are diagrams schematically showing layered structures of the electrophotographic photosensitive member, which is an example of a laminated semiconductor device according to this invention.
Figure 3B:
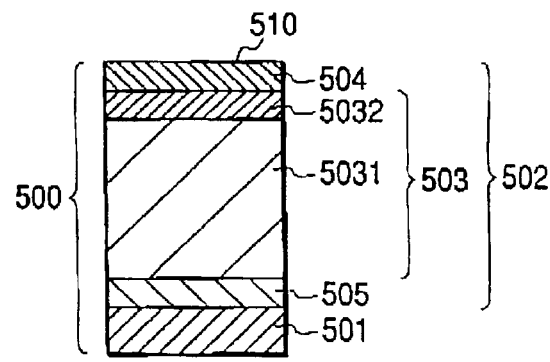
Figure 3C:
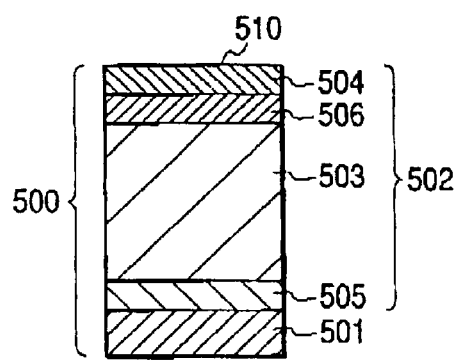

FIGS. 3A to 3C are schematic diagrams illustrating layered structures of the electrophotographic photosensitive member manufactured according to this invention.

A photosensitive member 500 shown in FIG. 3A comprises a substrate 501 and a photoreception layer 502 provided thereon. The photoreception layer 502 comprises an a-Si based charge injection blocking layer 505, a photoconductive layer 503, which is made of an amorphous silicon containing hydrogen atoms (H) and/or halogen atoms (X) (a-Si: H,X) and has photoconductivity, and an a-SiC based surface layer 504 in this order from the substrate 501 toward a free surface 510.

The photosensitive member 500 shown in FIG. 3B comprises the substrate 501 and the photoreception layer 502 provided thereon. The photoreception layer 502 comprises the a-Si based charge injection blocking layer 505, the photoconductive layer 503 made of a-Si: H,X and having photoconductivity, and the a-SiC based surface layer 504 in this order from the substrate 501. The photoconductive layer 503 is composed of a first layer region 5031 and a second layer region 5032.

The photosensitive member 500 shown in FIG. 3C comprises the substrate 501 and the photoreception layer 502 provided thereon. The photoreception layer 502 comprises the a-Si based charge injection blocking layer 505, the photoconductive layer 503 made of a-Si: H,X and having photoconductivity, an a-SiC based intermediate layer, and the a-SiC based surface layer 504 in this order from the substrate 501.

<Substrate>

The substrate used in this invention may be electrically conductive or insulating. The material of the conductive substrate may be a metal, such as Al, Cr, Mo, Au, In, Nb, Te, V, Ti, Pt, Pd and Fe, or an alloy thereof, such as stainless steel. Alternatively, an insulating substrate which is made of a film or sheet of a synthetic resin such as polyester, polyethylene, polycarbonate, cellulose acetate, polypropylene, polyvinyl chloride, polystyrene, polyamide, glass or ceramics and whose surface, on which the photoreception layer is formed, is processed to be conductive may be used.

The substrate used in this invention may have a shape of a cylinder or plate with a smooth or concave and convex surface. The thickness thereof is appropriately determined so as to provide a desired semiconductor device. If the substrate needs to be flexible, it can be thinned as far as it can sufficiently fulfill the function as a substrate. However, in terms of manufacture and handling, the thickness is typically 10 $\mu$m or more in consideration of mechanical strength.

<Photoconductive Layer>

According to this invention, the photoconductive layer, which is formed on the substrate to effectively attain the objects of this invention and forms a part of the photoreception layer, is formed by the plasma CVD method by appropriately setting a numerical condition of a film deposition parameter so as to provide desired characteristics.

The photoconductive layer can be formed essentially by introducing a source gas for supplying silicon atoms (Si), and a source gas for supplying hydrogen atoms (H) and/or a source gas for supplying halogen atoms (X) into the reactor, whose internal pressure can be reduced, in a desired gas condition, and producing a glow discharge in the reactor to form a layer of a-Si: H,X on a predetermined substrate previously disposed at a predetermined position.

According to this invention, it is required that the photoconductive layer contains hydrogen atoms and/or halogen atoms. This is essential to compensating for dangling bonds of the silicon atoms and improving the layer quality, in particular, photoconductivity and charge retention characteristics.

Therefore, the content of the hydrogen atoms or halogen atoms or a sum of the hydrogen atoms and the halogen atoms is desirably 10 to 40 atomic % of the sum of the silicon atoms and the hydrogen atoms and/or halogen atoms.

The material that can effectively used for the gas for supplying Si in this invention may be a silicon hydride (silane) which is in the gas state or can be gasified, such as $SiH_4$, $Si_2H_6$, $Si_3H_8$ and $Si_4H_{10}$. In particular, $SiH_4$ and $Si_2H_6$ are preferred in terms of ease of handling and Si supply efficiency during forming the layer.

Furthermore, in order to structurally introduce hydrogen atoms into the photoconductive layer to be formed, facilitate the control of the introduction ratio of the hydrogen atoms and to provide film characteristics to attain the objects of this invention, such gases are preferably mixed with a desired amount of a gas of $H_2$ and/or He or suicide gas containing a hydrogen atom for forming the layer. The gases can be used not only singly but also as a mixture of a plurality of them mixed by a predetermined ratio.

Preferably, the source gas for supplying halogen atoms used effectively in this invention may be a halogen compound which is in the gas state or can be gasified, such as a halogen gas, a halide, an interhalogen containing a halogen and a silane derivative with a halogen atom substituting for a hydrogen atom. Furthermore, it may be a silicon hydride compound containing a halogen atom which is in the gas state or can be gasified and contains a silicon atom and a halogen atom. Specifically, the halogen compound that can be suitably used in this invention may be an interhalogen, such as fluorine gas ($F_2$), BrF, ClF, $ClF_3$, $BrF_3$, $BrF_5$, $IF_3$ and $IF_7$. Specifically, the silicon compound containing a halogen atom, that is, the silane derivative with a halogen atom substituting for a hydrogen atom may preferably be silicon fluoride, such as $SiF_4$ and $Si_2F_6$.

In order to control the amount of the hydrogen atoms and/or halogen atoms contained in the photoconductive layer, a temperature of a substrate, the amount of the raw material introduced into the reactor to contain the hydrogen atoms and/or halogen atoms in the photoconductive layer, the discharge power and the like can be controlled, for example.

In this invention, the photoconductive layer preferably contains an atom for controlling the conductivity.

The atom for controlling the conductivity contained in the photoconductive layer may be an atom, which is referred to as an impurity in the semiconductor field. In this invention, an atom belonging to the III-B group in the periodic table (abbreviated as a III-B group atom, hereinafter) which provides a p-type conductivity and an atom belonging to the V-B group in the periodic table (abbreviated as a V-B group atom, hereinafter) which provides a n-type conductivity may be used.

Specifically, the III-B group atom includes boron (B), aluminum (Al), gallium (Ga), indium (In), thallium (Tl) and the like. In particular, B, Al and Ga are suitable.

Specifically, the V-B group atom includes P (phosphorus), As (arsenic), Sb (antimony) and Bi (bismuth) and the like. In particular, P and As are suitable.

The content of the atom for controlling the conductivity contained in the photoconductive layer is preferably $1 \times 10^{-2}$ to $1 \times 10^4$ atomic ppm, more preferably $5 \times 10^{-2}$ to $5 \times 10^3$ atomic ppm, and most preferably $1 \times 10^{-1}$ to $1 \times 10^3$ atomic ppm.

In order to structurally introducing the atom for controlling the conductivity, a gas state raw material for supplying the atom for controlling the conductivity can be introduced into the reactor together with the other gases for forming the photoconductive layer during the formation of the layer.

The raw material for introducing the atom for controlling the conductivity is desirably in the gas state under an ordinary temperature and normal pressure, or at least can readily gasified under the condition for forming the layer.

The raw material for introducing the III-B group atom, in particular, the raw material for introducing boron atoms may be a boron hydride such as $B_2H_6$, $B_4H_{10}$, $B_5H_9$, $B_5H_{11}$, $B_6H_{10}$, $B_6H_{12}$ and $B_6H_{14}$, or boron halide such as $BF_3$, $BCl_3$, $BBr_3$. Besides, it may be $AlCl_3$, $GaCl_3$, $Ga(CH_3)_3$, $InCl_3$ and $TlCl_3$.

The raw material effectively used for introducing the V-B group atom, in particular, the raw material for introducing phosphorus atoms may be a phosphorus hydride, such as $PH_3$ and $P_2H_4$, or phosphorus halide, such as $PH_4I$, $PF_3$, $PF_5$, $PCl_3$, $PCl_5$, $PBr_3$, $PBr_5$ and $PI_3$. Besides, a starting material for introducing the V-B group atom, such as $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$ and $BiBr_3$, may be effective.

If necessary, such a raw material for introducing the atom for controlling the conductivity can be diluted with a gas of $H_2$, He, Ar, Ne or the like.

Furthermore, it is effective that the photoconductive layer contains carbon atoms, oxygen atoms and/or nitrogen atoms. The content of each of the carbon atoms, oxygen atoms and/or nitrogen atoms is preferably $1 \times 10^{-5}$ to 10 atomic % of the sum of the silicon atoms, carbon atoms, oxygen atoms and nitrogen atoms, more preferably $1 \times 10^{-4}$ to 8 atomic % thereof, and most preferably $1 \times 10^{-3}$ to 5 atomic % thereof. The carbon atoms, oxygen atoms and/or nitrogen atoms may be uniformly contained in the photoconductive layer or partially nonuniformly distributed so that the content thereof varies in the direction of the thickness of the photoconductive layer.

According to this invention, the thickness of the photoconductive layer is appropriately determined as desired in terms of the ability of providing desired electrophotographic characteristics, economical effect and the like. The thickness is preferably 10 to 50 $\mu$m, more preferably 15 to 45 $\mu$m, and most preferably 20 to 40 $\mu$m. If the thickness is less than 10 $\mu$m, the electrophotographic characteristics, such as electrification capability and sensitivity, becomes practically insufficient. If the thickness is more than 50 $\mu$m, the time required to form the photoconductive layer becomes long, and the production cost is increased.

In order to attain the objects of this invention and form the photoconductive layer having desired film characteristics, it is necessary to appropriately set the mixing ratio between the gas for supplying Si and the diluent gas, the gas pressure in the reactor, the discharge power and the temperature of the substrate.

Similarly, an optimal range of the pressure in the reactor is appropriately selected according to the layer design. The optimal range is typically $1 \times 10^{-2}$ to $1 \times 10^3$ Pa, preferably $5 \times 10^{-2}$ to $5 \times 10^2$ Pa, and most preferably $1 \times 10^{-1}$ to $1 \times 10^2$ Pa.

Furthermore, an optimal range of the temperature of the substrate is appropriately selected according to the layer design. Typically, the optimal range is preferably 150 to 350 degrees Celsius, more preferably 180 to 330 degrees Celsius, and most preferably 200 to 300 degrees Celsius.

According to this invention, the ranges described above are desired numerical ranges of the temperature of the substrate and gas pressure for forming the photoconductive layer. However, the conditions should not be determined independently and separately, and the optimal values are desirably determined in a mutual and organic manner to provide the photosensitive member having desired characteristics.

<Charge Injection Blocking Layer>

For the photosensitive member according to this invention, it is further effective that a charge injection blocking layer serving to block injection of a charge from the conductive substrate side is provided between the conductive substrate and the photoconductive layer. That is, the charge injection blocking layer has a capability of blocking injection of a charge from the substrate side toward the photoconductive layer when the free surface of the photoreception layer is electrified to have a certain polarity and does not exhibit such a capability when the free surface is electrified to have the opposite polarity. In order to impart such a capability, a large quantity of atoms for controlling the conductivity may be effectively contained in the charge injection blocking layer.

The atoms for controlling the conductivity contained in the layer may be uniformly distributed in the layer, or may be partially nonuniformly distributed while distributed uniformly in the direction of the thickness. If the distribution is not uniform, the atoms are suitably distributed to become denser toward the substrate.

In any case, however, it is essential that the atoms are contained with an uniform distribution in a plane parallel to the substrate surface in order to provide uniform characteristics in the plane.

The atom for controlling the conductivity contained in the charge injection blocking layer may be an atom, which is referred to as an impurity in the semiconductor field. For a photosensitive member to be positively electrified, an atom belonging to the III-B group in the periodic table (abbreviated as a III-B group atom, hereinafter) which provides a p-type conductivity may be used.

Specifically, the III-B group atom includes boron (B), aluminum (Al), gallium (Ga), indium (In), thallium (Tl) and the like. In particular, B, Al and Ga are suitable.

For a photosensitive member to be negatively electrified, an atom belonging to the V-B group in the periodic table (abbreviated as a V-B group atom, hereinafter) which provides an n-type conductivity may be used.

Specifically, the V-B group atom includes P (phosphorus), As (arsenic), Sb (antimony) and Bi (bismuth) and the like. In particular, P and As are suitable.

According to this invention, the content of the atom for controlling the conductivity contained in the charge injection blocking layer is appropriately determined as desired so as to effectively attain the objects of this invention. The content is preferably 10 to $1 \times 10^4$ atomic ppm, more preferably 50 to $5 \times 10^3$ atomic ppm, and most preferably $1 \times 10^2$ to $3 \times 10^3$ atomic ppm.

In addition, the charge injection blocking layer may contain at least one of carbon, oxygen and nitrogen atoms to further increase the adhesion with another layer provided in direct contact with the charge injection blocking layer.

The carbon atoms, oxygen atoms or nitrogen atoms contained in the charge injection blocking layer may be uniformly contained in the layer, or may be partially nonuniformly distributed while distributed uniformly in the direction of the thickness. In any case, however, it is essential that the atoms are contained with an uniform distribution in a plane parallel to the substrate surface in order to provide uniform characteristics in the plane.

According to this invention, the content of the carbon atoms, nitrogen atoms and/or oxygen atoms contained in the whole of the charge injection blocking layer is appropriately determined as desired so as to effectively attain the objects of this invention. The content, which is the amount of one kind of atoms when one kind of atoms is contained or the total sum when two or more kinds of atoms are contained, is preferably $1 \times 10^{-3}$ to 30 atomic %, more preferably $5 \times 10^{-3}$ to 20 atomic %, and most preferably $1 \times 10^{-2}$ to 10 atomic %.

According to this invention, the hydrogen atoms and/or halogen atoms contained in the charge injection blocking layer compensates for dangling bonds in the layer and thus is effective in improving the layer quality. The content of the hydrogen atoms or halogen atoms in the charge injection blocking layer or total content of the hydrogen atoms and halogen atoms in the layer is preferably 1 to 50 atomic %, more preferably 5 to 40 atomic %, and most preferably 10 to 30 atomic %.

According to this invention, the thickness of the charge injection blocking layer is preferably 0.1 to 5 μm, more preferably 0.3 to 4 μm, and most preferably 0.5 to 3 μm in terms of the ability of providing desired electrophotographic characteristics, economical effect and the like. If the thickness is less than 0.1 μm, the capability of blocking injection of charges from the substrate is insufficient and electrification capability becomes insufficient. If the thickness is more than 5 μm, improvement of the electrophotographic characteristics cannot be expected and on the contrary, the production cost is increased due to the extended production time.

In order to form the charge injection blocking layer with characteristics that enable the objects of this invention to be attained, as in the case of the photoconductive layer, it is necessary to appropriately set the mixing ratio between the gas for supplying Si and the diluent gas, the gas pressure in the reactor, the discharge power and the temperature of the substrate.

Similarly, an optimal range of the pressure in the reactor is appropriately selected according to the layer design. The optimal range is typically $1 \times 10^{-2}$ to $1 \times 10^3$ Pa, preferably $5 \times 10^{-2}$ to $5 \times 10^2$ Pa, and most preferably $1 \times 10^{-1}$ to $1 \times 10^2$ Pa.

Furthermore, an optimal range of the temperature of the substrate is appropriately selected according to the layer design. Typically, the optimal range is preferably 150 to 350 degrees Celsius, more preferably 180 to 330 degrees Celsius, and most preferably 200 to 300 degrees Celsius.

According to this invention, the ranges described above are desired numerical ranges of the mixed diluent gas ratio, gas pressure, discharge power and temperature of the substrate for forming the charge injection blocking layer. Typically, however, these factors for forming the layer should not be determined independently and separately, and the optimal values of the respective factors are desirably determined in a mutual and organic manner to provide the surface layer with desired characteristics.

<Surface Layer>

According to this invention, a surface layer made of amorphous-silicon-based material is preferably formed on the photoconductive layer formed on the substrate as described above. The surface layer has a free surface and Is intended to attain the objects of this invention in terms of moisture resistance, continuous duty characteristic, withstand voltage, working environmental capability and durability.

According to this invention, the amorphous materials of the photoconductive layer and surface layer of the photoreception layer commonly comprise silicon atoms. Therefore, chemical stability at the interface between the layers is sufficiently assured.

The surface layer may be made of any amorphous-silicon-based material. For example, an amorphous silicon containing hydrogen atoms (H) and/or halogen atoms (X) and carbon atoms (referred to as a-SiC: H,X, hereinafter), an amorphous silicon containing hydrogen atoms (H) and/or halogen atoms (X) and oxygen atoms (referred to as a-SiO: H,X, hereinafter), an amorphous silicon containing hydrogen atoms (H) and/or halogen atoms (X) and nitrogen atoms (referred to as a-SiN: H,X, hereinafter), and an amorphous silicon containing hydrogen atoms (H) and/or halogen atoms (X) and at least one of carbon, oxygen or nitrogen atoms (referred to as a-SiCON: H,X, hereinafter) are suitably used.

According to this invention, in order to effectively attain the object thereof, the surface layer is formed by a vacuum deposition film formation method by appropriately setting a numerical condition of a film formation parameter so as to provide desired characteristics. Specifically, for example, it can be formed by various thin film deposition methods, such as a glow discharge method (alternating current discharge CVD method such as low frequency CVD, high frequency CVD and microwave CVD, direct current discharge CVD method or the like), sputtering, vacuum evaporation, ion plating, photo-CVD method and thermal-CVD method. The thin film deposition methods are appropriately selected according to factors including a manufacturing condition, capital investment load, manufacturing scale, desired characteristics of the photosensitive member to be formed. However, a deposition method equal to that used for the photoconductive layer in terms of productivity of the photosensitive member is preferably adopted.

For example, the surface layer made of a-SiC: H,X can be formed by the glow discharge method essentially by introducing a source gas for supplying silicon atoms (Si), a source gas for supplying carbon atoms (C) and a source gas for supplying hydrogen atoms (H) and/or a source gas for supplying halogen atoms (X) into the reactor, whose internal pressure can be reduced, in a desired gas condition, and producing a glow discharge in the reactor to form a layer of a-SiC; H,X on the substrate previously disposed at a predetermined position and having the photoconductive layer formed thereon.

The material of the surface layer used in this invention may be any amorphous material containing silicon. It is preferably a silicon compound containing at least one element of carbon, nitrogen and oxygen, and in particular, a material containing a-SiC as a principal component.

If the surface layer contains a-SiC as a principal component, the carbon content is preferably 30% to 90% of the total content of the silicon atoms and carbon atoms.

According to this invention, it is required that the surface layer contains hydrogen atoms and/or halogen atoms. This is essential to compensating for dangling bonds of the silicon atoms and improving the layer quality, in particular, photoconductivity and charge retention characteristics. The hydrogen content is typically 30 to 70 atomic %, preferably 35 to 65 atomic %, and most preferably 40 to 60 atomic % of the total sum of the constituent atoms. The fluorine content is typically 0.01 to 15 atomic %, preferably 0.1 to 10 atomic %, and most preferably 0.6 to 4 atomic %.

The photosensitive member formed with the hydrogen and fluorine contents falling within these ranges has a high practical applicability not possible with conventional photosensitive member. As known, a defect in the surface layer (primarily, a dangling bond of a silicon atom or carbon atom) adversely affects the characteristics of the electrophotographic photosensitive member. For example, the adverse effect may be a degradation of electrification characteristics due to the injection of a charge from the free surface, a variation in the electrification characteristics due to a change in the surface structure in a working environment, such as high humidity, and an afterimage caused during repeated use by a charge being injected to the surface layer during corona electrification or light irradiation and trapped by a defect in the surface layer.

However, if the hydrogen content in the surface layer is controlled to be 30 atomic % or higher, the defects in the surface layer is significantly reduced, and consequently, the surface layer can be dramatically improved in terms of electrical characteristics and high-rate continuous duty.

On the other hand, if the hydrogen content in the surface layer is higher than 70 atomic %, the hardness of the surface layer is decreased and thus, the surface layer cannot withstand repeated use. Therefore, controlling the hydrogen content in the surface layer to fall within the above-described range is a quite important factor that provides desired excellent electrophotographic characteristics. The hydrogen content in the surface layer can be controlled via the flow rates (ratio) of the source gases, temperature of the substrate, discharge power, gas pressure or the like.

Controlling the fluorine content in the surface layer to be equal to or higher than 0.01 atomic % enables the silicon atoms and the carbon atoms in the surface layer to be more effectively coupled with each other. Furthermore, the fluorine atoms in the surface layer can serve to effectively prevent disconnection between the silicon atoms and the carbon atoms due to a damage caused by corona or the like.

If the fluorine content in the surface layer is higher than 15 atomic %, the effect of coupling the silicon atoms and the carbon atoms in the surface layer and the effect of preventing disconnection between the silicon atoms and the carbon atoms due to a damage caused by corona or the like almost disappear. In addition, the excessive fluorine atoms inhibit travel of carriers in the surface layer, and thus, a residual potential and an image memory become remarkable. Therefore, controlling the fluorine content in the surface layer to fall within the above-described range is an important factor that provides desired electrophotographic characteristics. As in the case of the hydrogen content, the fluorine content in the surface layer can be controlled via the flow rates (ratio) of the source gases, temperature of the substrate, discharge power, gas pressure or the like.

The material that can be effectively used for the gas for supplying Si to form the surface layer of this invention may be a silicon hydride (silane) which is in the gas state or can be gasified, such as $SiH_4$, $Si_2H_6$, $Si_3H_8$ and $Si_4H_{10}$. In particular, $SiH_4$ and $Si_2H_6$ are preferred in terms of ease of handling and Si supply efficiency during forming the layer. If necessary, such a source gas for supplying Si can be diluted with a gas of $H_2$, He, Ar, Ne or the like.

The material that can be effectively used for the gas for supplying carbon may be a hydrocarbon which is in the gas state or can be gasified, such as $CH_4$, $C_2H_2$, $C_2H_6$, $C_3H_8$ and $C_4H_{10}$. In particular, $CH_4$, $C_2H_2$ and $C_2H_6$ are preferred in terms of ease of handling and C supply efficiency during forming the layer. If necessary, such a source gas for supplying C can be diluted with a gas of $H_2$, He, Ar, Ne or the like.

The material that can be effectively used for the gas for supplying nitrogen or oxygen may be a compound which is in the gas state or can be gasified, such as $NH_3$, NO, $N_2O$, $NO_2$, $O_2$, CO, $CO_2$ and $N_2$. If necessary, such a source gas for supplying nitrogen or oxygen can be diluted with a gas of $H_2$, He, Ar, Ne or the like.

Furthermore, in order to facilitate the control of the introduction ratio of the hydrogen atoms introduced into the surface layer to be formed, such gases are preferably mixed with a desired amount of hydrogen gas or silicide gas containing hydrogen atoms for forming the layer. The gases can be used not only singly but also as a mixture of a plurality of them mixed by a predetermined ratio.

Preferably, the effective source gas for supplying halogen atoms may be a halogen compound which is in the gas state or can be gasified, such as a halogen gas, a halide, an interhalogen containing a halogen and a silane derivative with a halogen atom substituting for a hydrogen atom. Furthermore, it may be a silicon hydride compound containing a halogen atom which is in the gas state or can be gasified and contains a silicon atom and a halogen atom. Specifically, the halogen compound that can be suitably used in this invention may be an interhalogen, such as fluorine gas ($F_2$), BrF, ClF, $ClF_3$, $BrF_3$, $BrF_5$, $IF_3$ and $IF_7$. Specifically, the silicon compound containing a halogen atom, that is, the silane derivative with a halogen atom substituting for a hydrogen atom may preferably be silicon fluoride, such as $SiF_4$ and $Si_2F_6$.

In order to control the amount of the hydrogen atoms and/or halogen atoms contained in the surface layer, the temperature of the substrate, the amount of the raw material introduced into the reactor to contain the hydrogen atoms and/or halogen atoms in the surface layer, the discharge power and the like can be controlled, for example.

The carbon atoms, oxygen atoms and/or nitrogen atoms may be uniformly contained in the surface layer or may be partially nonuniformly distributed so that the content thereof varies in the thickness direction.

The thickness of the surface layer of this invention is typically 0.01 to 3 μm, preferably 0.05 to 2 μm, and most preferably 0.1 to 1 μm. If the thickness is less than 0.01 μm, the surface layer is lost due to wear or the like during use of the photosensitive member. If the thickness is more than 3 μm, degradation in electrophotographic characteristics, such as increase of the residual potential, appears.

The surface layer according to this invention is carefully formed so as to provide desired characteristics thereof. A material containing Si, C and/or N and/or O, and H and/or X may have a crystalline or amorphous structure, exhibit a conductive, semi-conducting or insulating electrical property, and exhibit a photoconductive or non-photoconductive property, depending on a forming condition of the material. In this invention, the forming condition is strictly selected as desired to provide a compound with desired characteristics for the purpose.

For example, when the surface layer is primarily intended to enhance the withstand voltage, it is made of a non-single-crystalline material that shows a remarkable electrical insulation performance in the working environment thereof.

When the surface layer is primarily intended to enhance the continuous duty characteristic and working environmental capability, the above-described electrical insulation performance is reduced to some extent, and it is made of a non-single-crystalline material that has a certain level of sensitivity to the applied light.

In order to form the surface layer with characteristics that enable the objects of this invention to be attained, it is necessary to appropriately set the temperature of the substrate and the gas pressure in the reactor as desired.

An optimal range of the temperature (Ts) of the substrate is appropriately selected according to the layer design. Typically, the optimal range is preferably 150 to 350 degrees Celsius, more preferably 180 to 330 degrees Celsius, and most preferably 200 to 300 degrees Celsius.

Similarly, an optimal range of the pressure in the reactor is appropriately selected according to the layer design. The optimal range is typically $1 \times 10^{-2}$ to $1 \times 10^{3}$ Pa, preferably $5 \times 10^{-2}$ to $5 \times 10^{2}$ Pa, and most preferably $1 \times 10^{-1}$ to $1 \times 10^{2}$ Pa.

According to this invention, the ranges described above are desired numerical ranges of the temperature of the substrate and gas pressure for forming the surface layer. However, the conditions should not be determined independently and separately, and the optimal values are desirably determined in a mutual and organic manner to provide the photosensitive member having desired characteristics.

Between the surface layer and the photoconductive layer, there may be provided a region in which the content of carbon atoms, oxygen atoms and/or nitrogen atoms varies so that it decreases toward the photoconductive layer. This allows the adhesion between the surface layer and the photoconductive layer to be enhanced, thereby facilitating movement of a photo carrier to the surface and reducing interference due to reflection of light from the interface between the photoconductive layer and the surface layer.

<Intermediate Layer>

For the photosensitive member according to this invention, it is effective that an intermediate layer (upper blocking layer), which serves to block injection of a charge from the surface layer side when being electrified to be negative, is provided between the photoconductive layer and the surface layer.

That is, the intermediate layer has a capability of blocking injection of a charge from the surface layer side toward the photoconductive layer when the free surface of the photo-reception layer is electrified to have a certain polarity and does not exhibit such a capability when the free surface is electrified to have the opposite polarity. In order to impart such a capability, a large quantity of atoms for controlling the conductivity may be effectively contained in the intermediate layer.

The atoms for controlling the conductivity contained in the layer may be uniformly distributed in the layer, or may be partially nonuniformly distributed while distributed uniformly in the direction of the thickness.

In any case, however, it is essential that the atoms are contained with an uniform distribution in a plane parallel to the substrate surface in order to provide uniform characteristics in the plane.

The atom for controlling the conductivity contained in the intermediate layer may be an atom, which is referred to as an impurity in the semiconductor field. An atom belonging to the III-B group in the periodic table (abbreviated as a III-B group atom, hereinafter) which provides a p-type conductivity may be used.

Specifically, the III-B group atom includes boron (B), aluminum (Al), gallium (Ga), indium (In), thallium (Tl) and the like. In particular, B, Al and Ga are suitable.

According to this invention, the content of the atom for controlling the conductivity contained in the intermediate layer is appropriately determined as desired so as to effectively attain the objects of this invention. The content is preferably 10 to $1 \times 10^{4}$ atomic ppm, more preferably 50 to $5 \times 10^{3}$ atomic ppm, and most preferably $1 \times 10^{2}$ to $3 \times 10^{3}$ atomic ppm.

The intermediate layer may be made of any amorphous-silicon-based material. However, it is preferably made of the same material as the surface layer.

Specifically, an amorphous silicon containing hydrogen atoms (H) and/or halogen atoms (X) and carbon atoms (referred to as a-SiC: H,X, hereinafter), an amorphous silicon containing hydrogen atoms (H) and/or halogen atoms (X) and oxygen atoms (referred to as a-SiO: H,X, hereinafter), a-SiN: H,X containing hydrogen atoms (H) and/or halogen atoms (X) and nitrogen atoms, and a-SiCON: H,X containing hydrogen atoms (H) and/or halogen atoms (X) and at least one of carbon, oxygen or nitrogen atoms are suitably used.

The carbon atoms, oxygen atoms or nitrogen atoms contained in the intermediate layer may be uniformly contained in the layer, or may be partially nonuniformly distributed while distributed uniformly in the direction of the thickness. In any case, however, it is essential that the atoms are contained with an uniform distribution in a plane parallel to the substrate surface in order to provide uniform characteristics in the plane.

According to this invention, the content of the carbon atoms, nitrogen atoms and/or oxygen atoms contained in the whole of the intermediate layer is appropriately determined as desired so as to effectively attain the objects of this invention. The content, which is the amount of one kind of atoms when one kind of atoms is contained or the total sum when two or more kinds of atoms are contained, preferably falls within a range of 10% to 70%.

According to this invention, it is required that the intermediate layer contains hydrogen atoms and/or halogen atoms. This is essential to compensating for dangling bonds of the silicon atoms and improving the layer quality, in particular, photoconductivity and charge retention characteristics. The hydrogen content is typically 30 to 70 atomic %, preferably 35 to 65 atomic % and most preferably 40 to 60 atomic % of the total sum of the constituent atoms. The halogen content is typically 0.01 to 15 atomic %, preferably 0.1 to 10 atomic %, and most preferably 0.6 to 4 atomic %.

According to this invention, the thickness of the intermediate layer is preferably 0.01 to 3 μm, more preferably 0.03 to 2 μm, and most preferably 0.05 to 1 μm in terms of the ability of providing desired electrophotographic characteristics, economical effect and the like. If the thickness is less than 0.01 μm, the capability of blocking injection of charges from the surface is insufficient and electrification capability becomes insufficient. If the thickness is more than 3 μm, improvement of the electrophotographic characteristics cannot be expected and on the contrary, the characteristics such as sensitivity may be degraded.

In order to form the intermediate layer with characteristics that enable the objects of this invention to be attained, as in the case of the surface layer, it is necessary to appropriately set the mixing ratio between the gas for supplying Si and the gas for supplying C, gas for supplying N and/or gas for supplying O, the gas pressure in the reactor, the discharge power and the temperature of the substrate 101.

Similarly, an optimal range of the pressure in the reactor is appropriately selected according to the layer design. The optimal range is typically $1 \times 10^{-2}$ to $1 \times 10^{3}$ Pa, preferably $5 \times 10^{-2}$ to $5 \times 10^{2}$ Pa, and most preferably $1 \times 10^{-1}$ to $1 \times 10^{2}$ Pa.

Furthermore, an optimal range of the temperature of the substrate is appropriately selected according to the layer design. Typically, the optimal range is preferably 150 to 350 degrees Celsius, more preferably 180 to 330 degrees Celsius, and most preferably 200 to 300 degrees Celsius.

According to this invention, the ranges described above are desired numerical ranges of the mixed diluent gas ratio, gas pressure, discharge power and temperature of the substrate for forming the intermediate layer. Typically, however, these factors for forming the layer should not be determined independently and separately, and the optimal values of the respective factors are desirably determined in a mutual and organic manner to provide the surface layer with desired characteristics.

Figure 4:
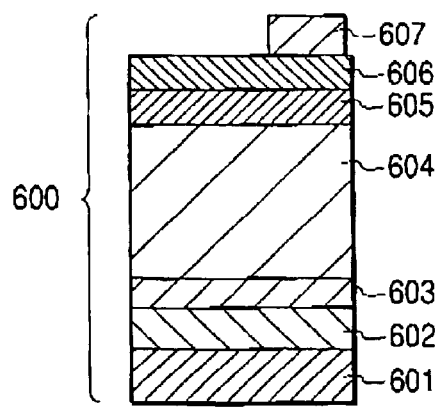
FIG. 4 is a diagram schematically showing a layered structure of a photovoltaic device, which is an example of the laminated semiconductor device according to this invention.
Figure 5:
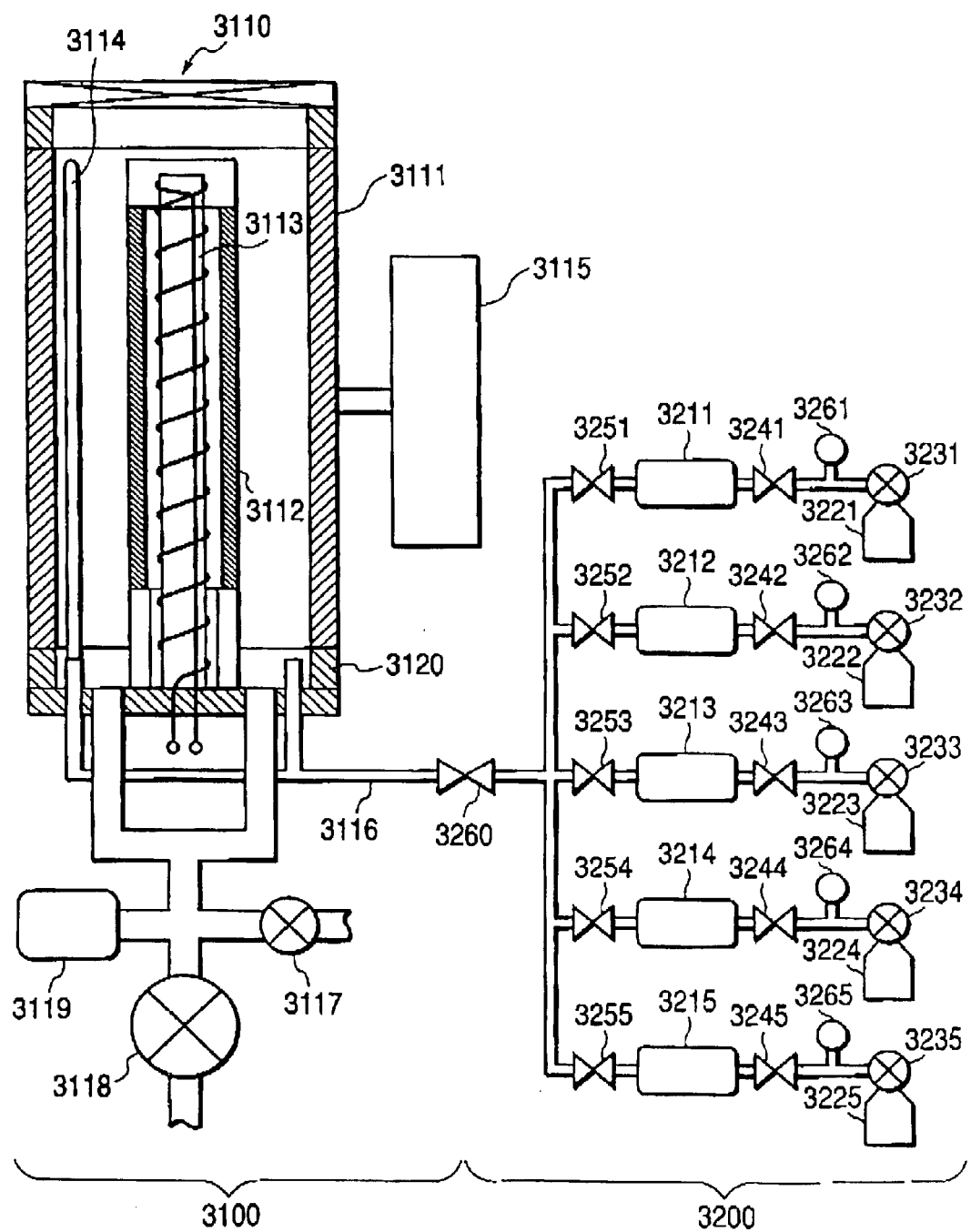
FIG. 5 is a diagram schematically showing a conventional apparatus for forming an electrophotographic photosensitive member based on the plasma CVD method using the RF frequency band.

FIG. 4 is a diagram schematically showing a layered structure of a photovoltaic device formed according to this invention A photovoltaic device 600 shown in FIG. 4 comprises a substrate 601, and a light reflection layer 602, an n-type layer 603, an i-type layer 604, a p-type layer 605 and a transparent electrode layer 606 sequentially stacked on the substrate, and a collector electrode 607 formed on the transparent electrode layer The photovoltaic device is irradiated with light from the side of the transparent electrode 606.

<Substrate>

The substrate may be an electric conductor or may be a substrate made of an insulating material or conductive material on which a conductive layer is formed. For example, the conductive material may be a metal such as a galvanized steel plate, NiCr, stainless steel, Al, Cr, Mo, Au, Nb, Ta, V, Ti, Pt, Pb and Sn or an alloy thereof.

The insulating material may be a synthetic resin such as polyester, polyethylene, polycarbonate, cellulose acetate, polypropylene, polyvinyl chloride, polyvinylidene chloride, polystyrene, polyamide, glass or ceramics. The insulating substrate has a conductive layer formed on at least one surface thereof, and a semiconductor layer according to this invention is formed on the surface on which the conductive layer is formed.

If the substrate is made of glass, a conductive layer of a material such as NiCr, Al, Ag, Cr, Mo, Ir, Nb, Ta, V, Ti, Pt, Pb, $In_2O_3$, ITO and ZnO or an alloy thereof is formed on the surface thereof. If the substrate is a synthetic resin sheet such as a polyester film, a conductive layer of a material such as NiCr, Al, Cr, Ag, Pb, Mo, Au, Nb, Ta, V, Ti and Pt or an alloy thereof is formed on the surface thereof. If the substrate is made of stainless steel, a conductive layer of a material such as NiCr, Al, Ag, Cr, Mo, Ir, Nb, Ta, V, Ti, Pt, Pb, $In_2O_3$, ITO and ZnO or an alloy thereof is formed. The forming method may be vacuum evaporation, sputtering or screen printing.

The surface of the substrate may be smooth or concave and convex (textured) with a maximum height of projections falling within a range of 0.1 to 1.0 μm. For example, one of methods for texturing the surface of the stainless steel substrate is etching using an acid solution. The thickness of the substrate is appropriately determined so as to provide a desired photovoltaic device. If the photovoltaic device needs to be flexible, the substrate can be thinned as far as it can sufficiently fulfill the function thereof. However, in terms of manufacture and handling, the thickness is typically 10 μm in consideration of mechanical strength.

<Light Reflection Layer>

In a desired substrate configuration of the photovoltaic device according to this invention, a conductive layer (light reflection layer) of a metal with a high reflectance in a range from visible radiation to near-infrared radiation, such as Ag, Al, Cu, AlSi and CuMg, is formed on the substrate described above. The light reflection layer is suitably formed by an electrolytic deposition method using an aqueous solution, such as vacuum evaporation and sputtering. A suitable thickness of the metal serving as the light reflection layer may be 10 nm to 5000 nm.

In a further desired substrate configuration of the photovoltaic device according to this invention, a transparent conductive layer of ZnO, $SnO_2$, $In_2O_3$, ITO, $TiO_2$, CdO, $Cd_2SnO_4$, $Bi_2O_2$, $MoO_3$, $NaxWO_3$ or the like on the light reflection layer. A suitable method for forming the transparent conductive layer may be vacuum evaporation, sputtering, electrolytic deposition, CVD method, spraying, spin-on or dipping. While the optimal thickness of the layer depends on the refractive index thereof, the thickness preferably falls within a range of 50 nm to 10 μm. To provide a textured transparent conductive layer, the temperature for forming the layer can be 200 degrees Celsius or higher if the sputtering is adopted, for example. In any forming method, etching of the surface with a weak acid after forming the layer is effective in enhancing the effect of texturing.

<Doped Layer (n-Type Layer, i-Type Layer)>

The doped layer is made of an amorphous-silicon-based or microcrystalline-silicon-based semiconductor. The amorphous-silicon-based semiconductor may be a-Si: H, a-SiC: H, a-SiO: H, a-SiN: H, a-SiCO: H, a-SiON: H, a-SiNC: H and a-SiCON: H. The microcrystalline-silicon-based semiconductor may be a microcrystalline silicon containing hydrogen atoms (μc-Si: H), μc-SiC: H, μc-SiO: H, μc-SiN: H, μc-SiCO: H, μc-SiON: H, μc-SiNC; H and μc-SiCON: H.

The hydrogen atoms (H, D) and halogen atoms (X) contained in the doped layer serve to compensate for the dangling bonds, thereby improving a doping efficiency. An optimal content thereof may be 0.1 to 30 atomic %. If the doped layer contains microcrystalline silicon, in particular, the optimal content may be 0.01 to 10 atomic %.

If the doped layer contains carbon, oxygen or nitrogen atoms, a preferred content thereof may be 0.1 ppm to 20%.

The doped layer needs to contain an atom for controlling the conductivity to provide p-type or n-type conductivity. The amount of the atom introduced may preferably falls within a range of 1000 ppm to 10%.

When forming the p-type layer or n-type layer suitable for the photovoltaic device, the temperature of the substrate in a deposition chamber is preferably 100 to 400 degrees Celsius, and the internal pressure is preferably 0.05 to 15 Pa.

For the source gas, a compound that contains silicon atoms and can be gasified, such as $SiH_4$, $Si_2H_6$, $SiF_4$, $SiFH_3$, $SiF_2H_2$, $SiF_3H$, $SiH_3D$, $SiFD_3$, $SiF_2D_2$, $SiD_3H$ and $Si_2D_3H_3$, may be used by adding thereto an impurity for controlling a valence electron, for example, a boron compound such as $B_2H_6$ and $BF_3$ for n-type or a phosphorus compound such as $PH_3$ for p-type. In addition, the compound that can be gasified may be appropriately diluted with a gas of $H_2$, He, Ne, Ar, Xe, Kr or the like to be introduced to the deposition chamber. In particular, when a layer with a low light absorption or wide band gap, such as of a microcrystalline semiconductor or a-SiC: H, is to be deposited, it is preferred that the source gas is diluted with hydrogen gas by a factor of 2 to 100 and a relatively high power is introduced.

<i-Type Layer>

In the photovoltaic device, the i-type layer is essential in that it generates and transports a carrier in response to light irradiation, and is made of an amorphous-silicon-based or microcrystalline-silicon-based semiconductor. The amorphous-silicon-based semiconductor may be a-Si: H, a-SiC; H, a-SiO: H, a-SiN: H, a-SiCO: H, a-SiON: H, a-SiNC: H and a-SiCON: H. The microcrystalline-silicon-based semiconductor may be $\mu$c-Si: H, $\mu$c-SiC: H, $\mu$c-SiO: H, $\mu$c-SiN: H, $\mu$c-SiCO: H, $\mu$c-SiON: H, $\mu$c-SiNC: H and $\mu$c-SiCON: H. The i-type layer may have a little p-type or n-type property.

The i-type layer is preferably doped with both of a valence electron controlling agent serving as a donor and a valence electron controlling agent serving as an acceptor.

The hydrogen atoms (H, D) and halogen atoms (X) contained in the i-type layer serve to compensate for the dangling bonds in the i-type layer, thereby improving both carrier mobility and life of the i-type layer. In addition, they serve to compensate for an interface state of an interface between the p-type layer and the i-type layer, thereby effectively improving a photoelectromotive force, photocurrent and photo-responsibility of the photovoltaic device. An optimal content of the hydrogen atoms and/or halogen atoms in the i-type layer may be 1 to 40 atomic %. In particular, the hydrogen atoms and/or halogen atoms are preferably distributed so that the content thereof becomes higher toward the interface between the p-type layer and the i-type layer. The content of the hydrogen atoms and/or halogen atoms in the vicinity of the interface is preferably 1.1 to 2 times the content thereof in the bulk of the layer. Furthermore, it is preferred that the content of the hydrogen atoms and/or halogen atoms varies with the content of silicon atoms. In a region where the content of the silicon atoms is a minimum, the content of the hydrogen atoms and/or halogen atoms preferably falls within a range of 1 to 10 atomic %, which is 0.3 to 0.8 times the content of the hydrogen atoms and/or halogen atoms in a region where the content is a maximum.

The thickness of the i-type layer heavily depends on the structure of the photovoltaic device and the band gap of the i-type layer. Optimally, the thickness may be 0.05 to 1 $\mu$m.

When forming the i-type layer suitable for the photovoltaic device, the temperature of the substrate in a deposition chamber is preferably 100 to 400 degrees Celsius, and the internal pressure is preferably 0.05 to 15 Pa.

For the source gas, a compound that contains silicon atoms and can be gasified, such as $SiH_4$, $Si_2H_6$, $SiF_4$, $SiFH_3$, $SiF_2H_2$, $SiF_3H$, $SiH_3D$, $SiFD_3$, $SiF_2D_2$, $SiD_3H$ and $Si_2D_3H_3$, may be used by adding thereto an impurity for controlling a valence electron, for example, a boron compound such as $B_2H_6$ and $BF_3$ and a phosphorus compound such as $PH_3$. In addition, the compound that can be gasified may be appropriately diluted with a gas of $H_2$, He, Ne, Ar, Xe, Kr or the like to be introduced to the deposition chamber. In particular, when a layer with a low light absorption or wide band gap, such as of a microcrystalline semiconductor or a-SiC: H, is to be deposited, it is preferred that the source gas is diluted with hydrogen gas by a factor of 2 to 100 and a relatively high power is introduced.

<Transparent Electrode Layer>

A suitable material for the transparent electrode may be indium oxide ($In_2O_3$), tin oxide ($SnO_2$) and ITO ($In_2O_3$—$SnO_3$), and the material may contain fluorine. The transparent electrode may be optimally deposited by sputtering or vacuum evaporation.

For example, when depositing the transparent electrode by sputtering, targets, such as a metal target and oxide target, are used in appropriate combination, and the temperature of the substrate preferably falls within a range of 20 to 600 degrees Celsius. A gas used for depositing the transparent electrode by sputtering may be an inert gas such as Ar gas. The deposition speed of the transparent electrode depends on a pressure in the discharge space or discharge pressure, and an optimal deposition speed falls within a range of 0.01 to 10 nm/sec.

The transparent electrode is preferably deposited to have a thickness satisfying a condition of an antireflection film. Specifically, the thickness of the transparent electrode preferably falls within a range of 50 to 500 nm.

<Collector Electrode>

To launch more light into the i-type layer, which is a photovoltaic layer, and efficiently collect generated carries at the electrode, the shape (viewed from a direction of launching light) and material of the collector electrode is important. Typically, the collector electrode has a shape of a comb, and the line width and the number of lines depend on the shape and size of the photovoltaic device viewed from the direction of launching light, the material of the collector electrode and the like. The line width is typically about 0.1 to 5 mm. The material of the collector electrode may be Fe, Cr, Ni, Au, Ti, Pd, Ag, Al, Cu, AlSi or C (graphite). Typically, metals with low resistivity, such as Ag, Cu, Al, Cr and C and alloys thereof are suitable. The layered structure of the collector electrode may be composed of one layer or a plurality of layers. The collector electrode is preferably formed by vacuum evaporation, sputtering, plating, printing or the like. The thickness thereof is suitably 10 nm to 0.5 mm.

EXAMPLES

Now, the present invention will be described in more detail with reference to examples. However, this invention should not be limited by these examples in any sense.

First Example

With the apparatus arranged as shown in FIG. 1, two high frequency powers (f1, f2) with different frequencies were supplied from the first high frequency power supply 1116 and the second high frequency power supply 1117 to the electrode 1114 to fabricate an electrophotographic photosensitive member consisting of a charge injection blocking layer, a photoconductive layer and a surface layer on a cylindrical aluminum cylinder with a diameter of 80 mm and a length of 358 mm under a condition shown in Table 1. In this example, an electrophotographic photosensitive member to be positively electrified was formed by changing the f2 during forming the photoconductive layer.

TABLE 1

|  | Charge injection blocking layer | Photoconductive layer | Surface layer |
|---|---|---|---|
| Kind and flow rate of gas |  |  |  |
| $SiH_4$ (ml/min (normal)) | 200 | 300 | 20 |
| $B_2H_6$ (ppm) (with respect to $SiH_4$) | 1000 | 2 → 0.1 |  |
| NO (ml/min (normal)) | 10 |  |  |
| $CH_4$ (ml/min (normal)) |  |  | 40 |
| Internal pressure (Pa) | 1.3 | 1.3 | 1.8 |
| f1 (MHz) | 100 | 100 | 100 |
| f2 (MHz) | 60 | 60 → 70 | 60 |
| Total power (W) | 1000 | 1500 | 800 |
| Power ratio (P2/P1 + P2) | 0.4 | 0.4 | 0.4 |
| Temperature of substrate (° C.) | 230 | 230 | 230 |
| Thickness (μm) | 3 | 35 | 0.5 |

First Comparative Example

An electrophotographic photosensitive member to be positively electrified was fabricated under the same condition as the first example except that the f2 during forming the photoconductive layer was constant (60 MHz).

The photosensitive members thus fabricated were installed in an IR-5000 copier manufactured by Canon Inc., and their respective characteristics were evaluated under a condition described below. Evaluation items were the "electrification capability", "sensitivity" and "ghost", and unevenness in the longitudinal direction was further measured for each of the items.

For the evaluation, under conditions of a process speed of 265 mm/sec, a quantity of pre-exposure light (LED of wavelength of 660 nm) of 4 lx·s and a current value of an electrifier of 1000 μA, a surface potential of the electrophotographic photosensitive member in a non-exposure state was measured with a potential sensor, specifically, a surface potential meter (Model 344 manufactured by TREK, Inc.) set at the position of the electrifier, and the surface potential was regarded as the electrification capability.

After the current value of the electrifier was adjusted so that the surface potential was 450 V (dark potential) in the non-exposure state, the photosensitive member was irradiated with an image exposure light (laser with a wavelength of 655 nm). Then, the output of the light source was adjusted so that the surface potential was 50 V (light potential), and the light exposure at that time was regarded as the sensitivity.

In addition, the photosensitive member was electrified under conditions that it assumes the dark potential in the non-exposure state as described above, exposed to light to be brought to the light potential state, and then, electrified again under the above-described conditions in the non-exposure state. The difference between the surface potentials before and after the exposure was regarded as the optical memory.

These items were measured in the longitudinal direction of the photosensitive member, and the unevenness of each item in the longitudinal direction was evaluated in terms of the ratio between the difference between the mean value and the maximum value thereof and the difference between the mean value and the minimum value thereof.

Furthermore, under conditions that the surface temperature of the photosensitive member was controlled at 60 degrees Celsius so that melt-adhesion readily occurs, the electrifier was adjusted to provide a dark area potential of 450 V at a position of a developing device, a blank paper was placed on a document table, and then a blank image was created by adjusting the exposure light to provide a light area potential of 50 V. A continuous paper feed test of 100 thousands papers was conducted in this way, and a black spot appearing on an image due to melt-adhesion of a developer was observed.

Results of the evaluation are shown in Table 11. In Table 11, items other than the melt-adhesion were evaluated with reference to the results of the first comparative example: a symbol AA indicates an improvement of 15% or more; a symbol A indicates an improvement of 5% or more and below 15%; and a symbol B indicates improvement of below 5%. Besides, the melt-adhesion was evaluated with reference to the result of the first comparative example in terms of the number of black spots on an image: a symbol AA indicates that the number of black spots is one-half of that in the first comparative example or less; a symbol A indicates that the number of black spots is more than one-half of and less than that in the first comparative example; a symbol B indicates that the number of black spots is substantially the same as that in the first comparative example; and a symbol C indicates that the number of black spots is more than that in the first comparative example.

As apparently seen from Table 11, for all the items, there was an explicit difference between the first example and the first comparative example. In addition, an image formed using the electrophotographic photosensitive member fabricated in the first example had a quite high quality without any ghost, image density unevenness, image smearing or the like.

Second Example

With the apparatus arranged as shown in FIG. 1, two high frequency powers (f1, f2) with different frequencies were supplied from the first high frequency power supply 1116 and the second high frequency power supply 1117 to the electrode 1114 to fabricate an electrophotographic photosensitive member consisting of a charge injection blocking layer, a photoconductive layer, an intermediate layer and a surface layer on a cylindrical aluminum cylinder with a diameter of 80 mm and a length of 358 mm under a condition shown in Table 2. In this example, an electrophotographic photosensitive member to be negatively electrified was formed by changing the f2 for each layer.

TABLE 2

|  | Charge injection blocking layer | Photo-conductive layer | Intermediate layer | Surface layer |
|---|---|---|---|---|
| Kind and flow rate of gas |  |  |  |  |
| $SiH_4$ (ml/min (normal)) | 150 | 200 | 50 | 20 |
| $B_2H_6$ (ppm) (with respect to $SiH_4$) |  |  | 500 |  |
| NO (ml/min (normal)) | 20 |  |  |  |
| $CH_4$ (ml/min (normal)) |  |  | 50 | 40 |
| Internal pressure (Pa) | 1.3 | 1.3 | 1.5 | 1.8 |
| f1 (MHz) | 100 | 100 | 100 | 100 |
| f2 (MHz) | 55 | 60 | 70 | 80 |
| Total power (W) | 800 | 1200 | 900 | 800 |
| Power ratio (P2/P1 + P2) | 0.6 | 0.6 | 0.6 | 0.6 |
| Temperature of substrate (° C.) | 200 | 230 | 230 | 220 |
| Thickness (μm) | 3 | 30 | 0.3 | 0.5 |

Second Comparative Example

An electrophotographic photosensitive member to be negatively electrified was fabricated under the same condition as the second example except that the f2 was kept constant (60 MHz) for all the layers.

The photosensitive member fabricated in the second example was evaluated with reference to the second comparative example as in the first example using the IR-5000 copier manufactured by Canon Inc., which had been altered for negative electrification. The results are shown in Table 11.

As apparently seen from Table 11, for all the items, there was an explicit difference between the second example and the second comparative example. In addition, an image formed using the electrophotographic photosensitive member fabricated in the second example had a quite high quality without any ghost, image density unevenness, image smearing or the like.

Third Example

With the apparatus arranged as shown in FIG. 1, two high frequency powers (f1, f2) with different frequencies from the first high frequency power supply 1116 and the second high frequency power supply 1117, respectively, and a high frequency power of 300 kHz (f3) from a high frequency power supply (not shown in the figure) were supplied to the electrode 1114 to fabricate an electrophotographic photosensitive member consisting of a charge injection blocking layer, a photoconductive, layer, an Intermediate layer and a surface layer on a cylindrical aluminum cylinder with a diameter of 80 mm and a length of 358 mm under a condition shown in Table 3. In this example, an electrophotographic photosensitive member to be negatively electrified was formed by changing the f2 and a power ratio (P2/P1+P2) for each layer.

TABLE 3

|  | Charge injection blocking layer | Photoconductive layer | Intermediate layer | Surface layer |
|---|---|---|---|---|
| Kind and flow rate of gas |  |  |  |  |
| SiH$_4$ (ml/min (normal)) | 150 | 200 | 50 | 50 → 20 |
| B$_2$H$_6$ (ppm) (with respect to SiH$_4$) |  | 500 |  |  |
| NO (ml/min (normal)) | 20 |  |  |  |
| CH$_4$ (ml/min (normal)) |  |  | 50 | 50 → 40 |
| Internal pressure (Pa) | 1.3 | 1.3 | 1.5 | 1.8 |
| f1 (MHz) | 80 | 80 | 80 | 80 |
| f2 (MHz) | 45 | 35 | 50 | 50 → 60 |
| f3 (KHz) | 300 | 300 | 300 | 300 |
| Power (P1 + P2) (W) | 800 | 1200 | 800 | 800 |
| Power ratio (P2/P1 + P2) | 0.4 | 0.3 | 0.4 | 0.4 → 0.5 |
| Power (P3) (W) | 200 | 200 | 200 | 200 |
| Temperature of substrate (° C.) | 200 | 230 | 230 | 220 |
| Thickness (μm) | 3 | 30 | 0.3 | 0.5 |

Third Comparative Example

An electrophotographic photosensitive member to be negatively electrified was fabricated under the same condition as the third example except that the f2 was kept constant (35 MHz) and the power ratio (P2/P1+P2) was kept constant (0.3) for all the layers.

The photosensitive member fabricated in the third example was evaluated with reference to the third comparative example as in the first example using the IR-5000 copier manufactured by Canon Inc., which had been altered for negative electrification. The results are shown in Table 11.

As apparently seen from Table 11, for all the items, there was an explicit difference between the third example and the third comparative example. In addition, an image formed using the electrophotographic photosensitive member fabricated in the third example had a quite high quality without any ghost, image density unevenness, image smearing or the like.

Fourth Example

With the apparatus arranged as shown in FIG. 1, two high frequency powers (f1, f2) with different frequencies were supplied from the first high frequency power supply 1116 and the second high frequency power supply 1117 to the electrode 1114 to fabricate an electrophotographic photosensitive member consisting of a charge injection blocking layer, a photoconductive layer and a surface layer on a cylindrical aluminum cylinder with a diameter of 108 mm and a length of 358 mm under a condition shown in Table 4. In this example, an electrophotographic photosensitive member to be positively electrified was formed by changing the f2 for each layer.

TABLE 4

|  | Charge injection blocking layer | Photoconductive layer | | Surface layer |
|---|---|---|---|---|
|  |  | Layer region 1 | Layer region 2 |  |
| Kind and flow rate of gas |  |  |  |  |
| SiH$_4$ (ml/min (normal)) | 150 | 300 | 300 | 20 |
| H$_2$ (ml/min (normal)) | 300 | 1000 | 1000 |  |
| B$_2$H$_6$ (ppm) (with respect to SiH$_4$) | 1500 | 1 | 0.3 |  |
| NO (ml/min (normal)) | 5 |  |  |  |
| CH$_4$ (ml/min (normal)) |  |  |  | 45 |
| Internal pressure (Pa) | 1.3 | 1.3 | 1.3 | 1.3 |
| f1 (MHz) | 200 | 200 | 200 | 200 |
| f2 (MHz) | 60 | 105 | 80 | 120 |
| Total power (W) | 800 | 1200 | 1200 | 1000 |
| Power ratio (P2/P1 + P2) | 0.4 | 0.4 | 0.4 | 0.4 |
| Temperature of substrate (° C.) | 200 | 230 | 230 | 200 |
| Thickness (μm) | 3 | 20 | 5 | 0.5 |

Fourth Comparative Example

An electrophotographic photosensitive member to be positively electrified was fabricated under the same condition as the fourth example except that the f2 was set at 105 MHz for all the layers.

The photosensitive bodies thus fabricated were installed in a GP-605 copier manufactured by Canon Inc., and their respective characteristics were evaluated under a condition described below.

For the evaluation, under conditions of a process speed of 300 mm/sec, a quantity of pre-exposure light (LED of wavelength of 700 nm) of 4 lx·s and a current value of an electrifier of 1000 μA, a surface potential of the electrophotographic photosensitive member in a non-exposure state was measured with a potential sensor, specifically, a surface potential meter (Model 344 manufactured by TREK, Inc.) set at the position of the electrifier of the electrophotographic apparatus, and the surface potential was regarded as the electrification capability.

After the current value of the electrifier was adjusted so that the surface potential was 400 V (dark potential) in the non-exposure state, the photosensitive member was irradiated with an image exposure light (laser with a wavelength of 680 nm) Then, the output of the light source was adjusted so that the surface potential was 50 V (light potential), and the light exposure at that time was regarded as the sensitivity.

In addition, the photosensitive member was electrified under conditions that it assumes the dark potential in the non-exposure state, exposed to light to be brought to the light potential state, and then, electrified again under the above-described conditions in the non-exposure state. The difference between the surface potentials before and after the exposure was regarded as the optical memory.

These items were measured in the longitudinal direction of the photosensitive member, and the unevenness of each item in the longitudinal direction was evaluated in terms of the ratio between the difference between the mean value and the maximum value thereof and the difference between the mean value and the minimum value thereof.

Furthermore, under conditions that the surface temperature of the photosensitive member was controlled at 60 degrees Celsius so that melt-adhesion readily occur, the electrifier was adjusted to provide a dark area potential of 400 V at a position of a developing device, a solid white paper was placed on a document table, and then a solid white image was created by adjusting the exposure light to provide a light area potential of 50 V. A continuous paper feed test of 100 thousands papers was conducted in this way, and a black spot appearing on an image due to melt-adhesion of a developer was observed.

Results of the evaluation are shown in Table 11. In Table 11, items other than the melt-adhesion were evaluated with reference to the results of the fourth comparative example: a symbol AA indicates an improvement of 15% or more; a symbol A indicates an improvement of 5% or more and below 15%; and a symbol B indicates improvement of below 5%. Besides, the melt-adhesion was evaluated with reference to the result of the fourth comparative example in terms of the number of black spots on an image: a symbol AA indicates that the number of black spots is one-half of that in the fourth comparative example or less; a symbol A indicates that the number of black spots is more than one-half of and less than that in the fourth comparative example; a symbol B indicates that the number of black spots is substantially the same as that in the fourth comparative example; and a symbol C indicates that the number of black spots is more than that in the fourth comparative example.

As apparently seen from Table 11, for all the items, there was an explicit difference between the fourth example and the fourth comparative example. In addition, an image formed using the electrophotographic photosensitive member fabricated in the fourth example had a quite high quality without any ghost, image density unevenness, image smearing or the like.

Fifth Example

With the apparatus arranged as shown in FIG. 1, two high frequency powers (f1, f2) with different frequencies were supplied from the first high frequency power supply 1116 and the second high frequency power supply 1117 to the electrode 1114 to fabricate an electrophotographic photosensitive member consisting of a charge injection blocking layer, a photoconductive layer and a surface layer on a cylindrical aluminum cylinder with a diameter of 108 mm and a length of 358 mm under a condition shown in Table 5. In this example, an electrophotographic photosensitive member to be positively electrified was formed by changing the f2 and the power ratio (P2/P1+P2) for each layer.

TABLE 5

| | Charge injection blocking layer | Photoconductive layer | | Surface layer |
|---|---|---|---|---|
| | | Layer region 1 | Layer region 2 | |
| Kind and flow rate of gas | | | | |
| SiH$_4$ (ml/min (normal)) | 150 | 300 | 300 | 20 |
| B$_2$H$_6$ (ppm) (with respect to SiH$_4$) | 1500 | 1 | 0.3 | |
| NO (ml/min (normal)) | 5 | | | |
| CH$_4$ (ml/min (normal)) | | | | 45 |
| Internal pressure (Pa) | 1.3 | 1.3 | 1.3 | 1.3 |
| f1 (MHz) | 200 | 200 | 200 | 200 |
| f2 (MHz) | 60 | 105 | 80 | 120 |
| Total power (W) | 800 | 1200 | 1200 | 1000 |
| Power ratio (P2/P1 + P2) | 0.45 | 0.3 → 0.4 | 0.4 | 0.6 |
| Temperature of substrate (° C.) | 200 | 230 | 230 | 200 |
| Thickness (μm) | 3 | 20 | 5 | 0.5 |

Fifth Comparative Example

An electrophotographic photosensitive member to be positively electrified was fabricated under the same condition as the fifth example except that the f2 was set at 105 MHz and the power ratio (P2/P1+P2) was set at 0.3 for all the layers.

The photosensitive member fabricated in the fifth example was evaluated with reference to the fifth comparative example as in the fourth example. The results are shown in Table 11.

As apparently seen from Table 11, for all the items, there was an explicit difference between the fifth example and the fifth comparative example. In addition, an image formed using the electrophotographic photosensitive member fabricated in the fifth example had a quite high quality without any ghost, image density unevenness, image smearing or the like.

Sixth Example

With the apparatus arranged as shown in FIG. 1, two high frequency powers (f1, f2) with different frequencies were supplied from the first high frequency power supply 1116 and the second high frequency power supply 1117 to the electrode 1114 to fabricate an electrophotographic photosensitive member consisting of a charge injection blocking layer, a photoconductive layer and a surface layer on a cylindrical aluminum cylinder with a diameter of 108 mm and a length of 358 mm under a condition shown in Table 6. In this example, an electrophotographic photosensitive member to be positively electrified was formed by changing the f2 and the power ratio (P2/P1+P2) for each layer.

TABLE 6

| | Charge injection blocking layer | Photoconductive layer | | Surface layer |
|---|---|---|---|---|
| | | Layer region 1 | Layer region 2 | |
| Kind and flow rate of gas | | | | |
| SiH$_4$ (ml/min (normal)) | 150 | 300 | 100 | 100 → 20 → 20 |

TABLE 6-continued

|  | Charge injection blocking layer | Photoconductive layer | | Surface layer |
|---|---|---|---|---|
|  |  | Layer region 1 | Layer region 2 |  |
| $B_2H_6$ (ppm) (with respect to $SiH_4$) | 1500 | 1 |  |  |
| NO (ml/min (normal)) | 5 |  |  |  |
| $CH_4$ (ml/min (normal)) |  |  |  | 10 → 40 → 45 |
| Internal pressure (Pa) | 1.3 | 1.3 | 1.3 | 1.3 |
| f1 (MHz) | 105 | 105 | 105 | 105 |
| f2 (MHz) | 70 | 60 → 50 | 50 | 80 → 60 |
| Total power (W) | 800 | 1500 | 1200 | 1000 |
| Power ratio (P2/P1 + P2) | 0.45 | 0.3 | 0.4 | 0.5 |
| Temperature of substrate (° C.) | 210 | 220 | 200 | 200 |
| Thickness (μm) | 3 | 25 | 3 | 0.5 |

Sixth Comparative Example

An electrophotographic photosensitive member to be positively electrified was fabricated under the same condition as the sixth example except that the f2 was set at 60 MHz and the power ratio (P2/P1+P2) was set at 0.3 for all the layers.

The photosensitive member fabricated in the sixth example was evaluated with reference to the sixth comparative example as in the fourth example. The results are shown in Table 11. As apparently seen from Table 11, for all the items, there was an explicit difference between the sixth example and the sixth comparative example. In addition, an image formed using the electrophotographic photosensitive member fabricated in the sixth example had a quite high quality without any ghost, image density unevenness, image smearing or the like.

Seventh Example

With the apparatus arranged as shown in FIG. 1, two high frequency powers (f1, f2) with different frequencies were supplied from the first high frequency power supply 1116 and the second high frequency power supply 1117 to the electrode 1114 to fabricate an electrophotographic photosensitive member consisting of a charge injection blocking layer, a photoconductive layer and a surface layer on a cylindrical aluminum cylinder with a diameter of 108 mm and a length of 358 mm under a condition shown in Table 7. In this example, an electrophotographic photosensitive member to be positively electrified was formed by changing the f2 and the power ratio (P2/P1+P2) for each layer.

TABLE 7

|  | Charge injection blocking layer | Photoconductive layer | | Surface layer |
|---|---|---|---|---|
|  |  | Layer region 1 | Layer region 2 |  |
| Kind and flow rate of gas |  |  |  |  |
| $SiH_4$ (ml/min (normal)) | 150 | 300 | 100 | 100 → 20 → 20 |
| He (ml/min (normal)) | 500 | 1000 | 1000 |  |
| $B_2H_6$ (ppm) (with respect to $SiH_4$) | 1500 | 1 |  |  |
| NO (ml/min (normal)) | 5 |  |  |  |
| $CH_4$ (ml/min (normal)) |  |  |  | 10 → 40 → 45 |
| Internal pressure (Pa) | 1.3 | 1.3 | 1.3 | 1.3 |
| f1 (MHz) | 105 | 105 | 105 | 105 |
| f2 (MHz) | 70 | 60 | 50 | 80 |
| Total power (W) | 800 | 1500 | 1200 | 1000 |
| Power ratio (P2/P1 + P2) | 0.45 | 0.3 → 0.35 | 0.4 | 0.5 → 0.6 |
| Temperature of substrate (° C.) | 210 | 220 | 200 | 200 |
| Thickness (μm) | 3 | 25 | 3 | 0.5 |

Seventh Comparative Example

An electrophotographic photosensitive member to be positively electrified was fabricated under the same condition as the seventh example except that the f2 was set at 60 MHz and the power ratio (P2/P1+P2) was set at 0.3 for all the layers.

The photosensitive member fabricated in the seventh example was evaluated with reference to the seventh comparative example as in the fourth example. The results are shown in Table 11.

As apparently seen from Table 11, for all the items, there was an explicit difference between the seventh example and the seventh comparative example. In addition, an image formed using the electrophotographic photosensitive member fabricated in the seventh example had a quite high quality without any ghost, image density unevenness, image smearing or the like.

Eighth Example

With the apparatus arranged as shown in FIG. 1, two high frequency powers (f1, f2) with different frequencies from the first high frequency power supply 1116 and the second high frequency power supply 1117, respectively, and a high frequency power of 500 kHz (f3) from a high frequency power supply (not shown) were supplied to the electrode 1114 to fabricate an electrophotographic photosensitive member consisting of a charge injection blocking layer, a photoconductive layer and a surface layer on a cylindrical aluminum cylinder with a diameter of 108 mm and a length of 358 mm under a condition shown in Table 8. In this example, an electrophotographic photosensitive member to be positively electrified was formed by changing the f2 and a power ratio (P2/P1+P2) for each layer region.

TABLE 8

|  | Charge injection blocking layer | Photoconductive layer | | Surface layer |
|---|---|---|---|---|
|  |  | Layer region 1 | Layer region 2 |  |
| Kind and flow rate of gas |  |  |  |  |
| $SiH_4$ (ml/min (normal)) | 150 | 300 | 150 | 100 → 20 → 20 |
| He (ml/min (normal)) |  |  | 1500 |  |
| $B_2H_6$ (ppm) (with respect to $SiH_4$) | 1500 | 1.5 |  |  |
| NO (ml/min (normal)) | 5 |  |  |  |
| $CH_4$ (ml/min (normal)) |  |  |  | 10 → 40 → 45 |
| Internal pressure (Pa) | 1.3 | 1.3 | 1.3 | 1.3 |
| f1 (MHz) | 105 | 105 | 105 | 105 |
| f2 (MHz) | 70 | 60 | 50 | 80 |
| f3 (KHz) | 500 | 500 | 500 | 500 |
| Power (P1 + P2) (W) | 800 | 1500 | 1200 | 1000 |
| Power ratio (P2/P1 + P2) | 0.45 | 0.3 | 0.4 | 0.6 |
| Power (P3) (W) | 200 | 300 | 200 | 150 |
| Temperature of substrate (° C.) | 200 | 230 | 230 | 200 |
| Thickness (μm) | 3 | 20 | 5 | 0.5 |

TABLE 9

|  | Charge injection blocking layer | Photo- conductive layer | Inter- mediate layer | Surface layer |
|---|---|---|---|---|
| Kind and flow rate of gas |  |  |  |  |
| $SiH_4$ (ml/min (normal)) | 200 | 300 | 50 | 50 → 20 → 20 |
| $B_2H_6$ (ppm) (with respect to $SiH_4$) |  |  | 500 |  |
| NO (ml/min (normal)) | 10 |  |  |  |
| $CH_4$ (ml/min (normal)) |  |  | 50 | 50 → 40 → 45 |
| Internal pressure (Pa) | 1.3 | 1.3 | 1.5 | 1.5 |
| f1 (MHz) | 160 | 160 | 160 | 160 |
| f2 (MHz) | 100 | 120 | 90 | 130 |
| Total power (W) | 800 | 1000 | 800 | 600 |
| Power ratio (P2/P1 + P2) | 0.35 | 0.4 | 0.5 | 0.6 |
| Temperature of substrate (° C.) | 230 | 230 | 200 | 200 |
| Thickness (μm) | 3 | 20 | 0.3 | 0.5 |

Eighth Comparative Example

An electrophotographic photosensitive member to be positively electrified was fabricated under the same condition as the eighth example except that the f2 was set at 60 MHz and the power ratio (P2/P1+P2) was set at 0.3 for all the layers.

The photosensitive member fabricated in the eighth example was evaluated with reference to the eighth comparative example as in the fourth example. The results are shown in Table 11.

As apparently seen from Table 11, for all the items, there was an explicit difference between the eighth example and the eighth comparative example. In addition, an image formed using the electrophotographic photosensitive member fabricated in the eighth example had a quite high quality without any ghost, image density unevenness, image smearing or the like.

Ninth Example

With the apparatus arranged as shown in FIG. 1, two high frequency powers (f1, f2) with different frequencies were supplied from the first high frequency power supply 1116 and the second high frequency power supply 1117 to the electrode 1114 to fabricate an electrophotographic photosensitive member consisting of a charge injection blocking layer, a photoconductive layer, an intermediate layer and a surface layer on a cylindrical aluminum cylinder with a diameter of 30 mm and a length of 358 mm under a condition shown in Table 9. In this example, an electrophotographic photosensitive member to be negatively electrified was formed by changing the f2 and the power ratio (P2/P1+P2) for each layer.

Ninth Comparative Example

An electrophotographic photosensitive member to be negatively electrified was fabricated under the same condition as the ninth example except that the f2 was set at 120 MHz and the power ratio (P2/P1+P2) was set at 0.4 for all the layers.

The photosensitive members thus fabricated were installed in a GP-215 copier manufactured by Canon Inc., which had been altered for this test, to evaluate their respective characteristics.

For the evaluation, under conditions of a process speed of 200 mm/sec, a quantity of pre-exposure light (LED of wavelength of 680 nm) of 4 lx·s and a current value of an electrifier of 1000 μA, a surface potential of the electrophotographic photosensitive member in a non-exposure state was measured with a potential sensor, specifically, a surface potential meter (Model 344 manufactured by TREK, Inc.) set at the position of the electrifier of the electrophotographic apparatus, and the surface potential was regarded as the electrification capability.

After the current value of the electrifier was adjusted so that the surface potential was 400 V (dark potential) in the non-exposure state, the photosensitive member was irradiated with an image exposure light (laser with a wavelength of 660 nm). Then, the output of the light source was adjusted so that the surface potential was 50 V (light potential), and the light exposure at that time was regarded as the sensitivity.

In addition, the photosensitive member was electrified under conditions that it assumes the dark potential in the non-exposure state, exposed to light to be brought to the light potential state, and then, electrified again under the above-described conditions in the non-exposure state. The difference between the surface potentials before and after the exposure was regarded as the optical memory.

These items were measured in the longitudinal direction of the photosensitive member, and the unevenness of each item in the longitudinal direction was evaluated in terms of the difference between the mean value and the maximum value thereof and the difference between the mean value and the minimum value thereof.

Furthermore, under conditions that the surface temperature of the photosensitive member was controlled at 60 degrees Celsius so that melt-adhesion readily occur, the electrifier was adjusted to provide a dark area potential of 400 V at a position of a developing device, a solid white paper was placed on a document table, and then a solid white image was created by adjusting the exposure light to provide a light area potential of 50 V. A continuous paper feed test of 100 thousands papers was conducted in this way, and a black spot appearing on an image due to melt-adhesion of a developer was observed.

Results of the evaluation are shown in Table 11. In Table 11, items other than the melt-adhesion were evaluated with reference to the results of the ninth comparative example: a symbol AA indicates an improvement of 15% or more; a symbol A indicates an improvement of 5% or more and below 15%; and a symbol B indicates improvement of below 5%. Besides, the melt-adhesion was evaluated with reference to the result of the ninth comparative example in terms of the number of black spots on an image: a symbol AA indicates that the number of black spots is one-half of that in the ninth comparative example or less; a symbol A indicates that the number of black spots is more than one-half of and less than that in the ninth comparative example; a symbol B indicates that the number of black spots is substantially the same as that in the ninth comparative example: and a symbol C indicates that the number of black spots is more than that in the ninth comparative example.

As apparently seen from Table 11, for all the items, there was an explicit difference between the ninth example and the ninth comparative example. In addition, an image formed using the electrophotographic photosensitive member fabricated in the ninth example had a quite high quality without any ghost, image density unevenness, image smearing or the like.

Tenth Example

With the apparatus arranged as shown in FIG. 1, two high frequency powers (f1, f2) with different frequencies were supplied from the first high frequency power supply 1116 and the second high frequency power supply 1117 to the electrode 1114 to fabricate an electrophotographic photosensitive member consisting of a charge injection blocking layer, a photoconductive layer and a surface layer on a cylindrical aluminum cylinder with a diameter of 80 mm and a length of 358 mm under a condition shown in Table 10. In this example, an electrophotographic photosensitive member to be negatively electrified was formed by changing the f2 and the power ratio (P2/P1+P2) for each layer.

TABLE 10

| | Charge injection blocking layer | Photoconductive layer | Surface layer |
|---|---|---|---|
| Kind and flow rate of gas | | | |
| $SiH_4$ (ml/min (normal)) | 200 | 300 | 100 → 20 → 20 |
| He (ml/min (normal)) | | 1000 | |
| NO (ml/min (normal)) | 30 | | |
| $CH_4$ (ml/min (normal)) | | | 10 → 40 → 45 |
| Internal pressure (Pa) | 1.3 | 1.3 | 1.5 |
| f1 (MHz) | 105 | 105 | 105 |
| f2 (MHz) | 65 | 60 | 70 |
| Total power (W) | 800 | 1200 | 600 |
| Power ratio (P2/P1 + P2) | 0.35 | 0.4 | 0.6 → 0.7 |
| Temperature of substrate (° C.) | 230 | 230 | 200 |
| Thickness (μm) | 3 | 25 | 0.5 |

Tenth Comparative Example

An electrophotographic photosensitive member to be negatively electrified was fabricated under the same condition as the tenth example except that the f2 was set at 60 MHz and the power ratio (P2/P1+P2) was set at 0.4 for all the layers.

The photosensitive member fabricated in the tenth example was evaluated with reference to the tenth comparative example as in the ninth example. The results are shown in Table 11.

As apparently seen from Table 11, for all the items, there was an explicit difference between the tenth example and the tenth comparative example. In addition, an image formed using the electrophotographic photosensitive member fabricated in the tenth example had a quite high quality without any ghost, image density unevenness, image smearing or the like.

TABLE 11

| | | | | | Unevenness in longitudinal direction | | |
|---|---|---|---|---|---|---|---|
| | Electrification capability | Sensitivity | Memory | Melt-adhesion | Electrification capability | Sensitivity | Memory |
| First Example | A | AA | AA | B | A | A | A |
| Second Example | AA | A | A | A | AA | AA | A |
| Third Example | AA | A | AA | A | AA | AA | A |
| Fourth Example | AA | A | A | A | AA | AA | A |
| Fifth Example | AA | A | AA | A | AA | AA | A |
| Sixth Example | AA | AA | AA | AA | AA | AA | AA |
| Seventh Example | AA | AA | AA | AA | AA | AA | AA |
| Eighth Example | AA | A | A | A | AA | A | A |
| Ninth Example | AA | A | AA | A | AA | A | A |
| Tenth Example | AA | A | AA | AA | AA | AA | AA |

Eleventh Example

With the apparatus arranged as shown in FIG. 2, a photovoltaic device configured as shown in FIG. 4 was fabricated.

First, a stainless steel having a thickness of 0.5 mm, a length of 300 mm and a width of 300 mm was dipped into acetone and isopropyl alcohol to be ultrasonic-cleaned, and then dried by hot air. By DC magnetron sputtering, a textured film of Ag having a thickness of 0.8 µm was deposited in a forming temperature of 300 degrees Celsius, and then, a textured transparent conductive film of ZnO having a thickness of 4 µm was deposited in the forming temperature of 300 degrees Celsius.

Then, with the apparatus arranged as shown in FIG. 2, two high frequency powers (f1, f2) with different frequencies were supplied from the first high frequency power supply 2116 and the second high frequency power supply 2117 to the electrode 2114 to form a p-type layer, an i-type layer and an n-type layer on the transparent conductive layer of ZnO under a condition shown in Table 12. In this formation, the layers were formed by changing the f2 and the power ratio between the two high frequency powers for each layer.

Then, by vacuum evaporation utilizing resistance heating, an ITO film having a thickness of about 600 angstrom to serve as the transparent electrode was deposited, and by vacuum evaporation utilizing an electron beam, a film of Au having a thickness of about 8000 angstrom to serve as the collector electrode was deposited. In this way, a photovoltaic device was fabricated.

For comparison, another photovoltaic device was fabricated under the same condition as the eleventh example except that the f2 was set at 70 MHz and the power ratio (P2/P1+P2) was set at 0.3 for all the layers.

The photovoltaic devices thus fabricated were irradiated with a light of AM 1.5, and a distribution of a release voltage in the substrate was examined. Then, it was confirmed that changing the frequencies and power ratio of the high frequency powers for each layer according to this invention resulted in a 10 percent reduction in the difference between the maximum value and minimum value of the release voltage in the substrate compared with the case where the frequencies and power ratio thereof were kept constant

TABLE 12

|  | n-type layer | i-type layer | p-type layer |
|---|---|---|---|
| Kind and flow rate of gas |  |  |  |
| SiH₄ (ml/min (normal)) | 30 | 100 | 10 |
| H₂ (ml/min (normal)) | 800 | 1600 | 200 |
| PH₇/H₂ (2%) (ml/min (normal)) | 10 |  |  |
| B₂H₆/H₂ (2%) (ml/min (normal)) |  |  | 2 |
| Internal pressure (Pa) | 5 | 3 | 5 |
| f1 (MHz) | 105 | 105 | 105 |
| f2 (MHz) | 60 | 70 | 50 |
| Total power (W) | 200 | 400 | 300 |
| Power ratio (P2/P1 + P2) | 0.4 | 0.3 | 0.45 |
| Temperature of substrate (° C.) | 230 | 250 | 180 |
| Thickness (µm) | 0.02 | 1 | 0.01 |

Twelfth Example

With the apparatus arranged as shown in FIG. 2, two high frequency powers (f1, f2) with different frequencies were supplied from the first high frequency power supply 2116 and the second high frequency power supply 2117 to the electrode 2114 to perform etching of a $SiO_2$ film formed on a Si wafer having a diameter of 200 mm placed on the substrate stage under conditions described below. A distribution of an etching rate was examined for whole of the substrate surface.

The etching was performed by changing the kind of the gas during the etching and changing the frequency f2 of the high frequency power accordingly.

$C_3F_8$: 100 (ml/min (normal))→$CF_4$: 100 (ml/min (normal))

$O_2$: 20 (ml/min (normal))

Internal pressure: 2 (Pa)

Frequency f1: 100 MHz, Frequency f2: 70 MHz→60 MHz

Total power; 800 (W), Power ratio (P2/P1+P2): 0.5

For comparison, etching was also performed under the same condition as the twelfth example except that the f2 during the etching was kept constant (70 MHz).

As a result, it was confirmed that even if a process condition, such as the gas kind, was changed during etching, changing the frequency f2 of the high frequency power resulted in a 20 percent reduction in the difference between the maximum and the minimum of the etching rate in the surface of the substrate compared with the case where the frequency f2 is kept constant, and thus, more uniform etching was performed on the substrate.

According to this invention, a plurality of high frequency powers with different frequencies are supplied to one and the same electrode, and a frequency of at least one of the high frequency powers is changed during a plasma processing. Thus, a substrate with a large area can be plasma-processed uniformly at a high process speed, and a deposition film having quite uniform thickness and quality can be formed at a high process speed.

In particular, a semiconductor device having a plurality of layer regions stacked on the substrate, uniform thickness and quality in any direction in the substrate and superior characteristics can be manufactured. Thus, the quality of the products can be improved and the manufacturing cost can be reduced since the ratio of conforming articles is increased.

What is claimed is:

1. A plasma processing method, comprising:

installing an object in a reactor which can be evacuated;

introducing a gas into the reactor;

synthesizing a plurality of high frequency powers to obtain a synthesized power;

decomposing the introduced gas with the synthesized power applied to an electrode to produce plasma; and processing the object with the plasma, wherein each of the plurality of high frequency powers has a different frequency, and the frequency of at least one of the plurality of high frequency powers is changed during the processing step.

2. The plasma processing method according to claim 1, wherein the plurality of high frequency powers comprises a first high frequency power having a frequency f1, and a second high frequency power having a frequency f2, and wherein:

frequency ranges of said frequencies f1 and f2 satisfy a following relation of:

10 MHz ≦ f2 < f1 ≦ 250 MHz        (A), a frequency ratio between said frequencies f1 and f2 satisfies a following relation of:

$$0.1 \leq f2/f1 \leq 0.9 \quad (B),$$

and said frequency f2 is changed in the processing step.

3. The plasma processing method according to claim 2, wherein, assuming that a power of said first high frequency power is denoted by P1 and a power of said second high frequency power is denoted by P2, a power ratio between said powers P1 and P2 satisfies a relation of:

$$0.1 \leq P2/(P1+P2) \leq 0.9 \quad (C).$$

4. The plasma processing method according to claim 3, wherein said frequency f2 is changed and said power ratio is changed within the range represented by the formula (C).

5. A method for manufacturing a semiconductor device, comprising:

installing an object in a reactor which can be evacuated;

introducing a gas into the reactor;

synthesizing a plurality of high frequency powers to obtain a synthesized power;

decomposing the introduced gas with a plurality of high frequency powers applied to an electrode to produce plasma; and processing the object with the plasma, wherein each of the plurality of high frequency powers has a different frequency, and the frequency of at least one of the plurality of high frequency powers is changed during the processing step.

6. The method for manufacturing a semiconductor device according to claim 5, wherein the plurality of high frequency powers comprises a first high frequency power having a frequency f1, and a second high frequency power having a frequency f2, and wherein:

frequency ranges of said frequencies f1 and f2 satisfy a following relation of:

$$10 \text{ MHz} \leq f2 < f1 \leq 250 \text{ MHz} \quad (A),$$

a frequency ratio between said frequencies f1 and f2 satisfies a following relation of:

$$0.1 \leq f2/f1 \leq 0.9 \quad (B),$$

and said frequency f2 is changed in the processing step.

7. The method for manufacturing a semiconductor device according to claim 6, wherein, assuming that a power of said first high frequency power is denoted by P1 and a power of said second high frequency power is denoted by P2, a power ratio between said powers P1 and P2 satisfies a relation of:

$$0.1 \leq P2/(P1+P2) \leq 0.9 \quad (C).$$

8. The method for manufacturing a semiconductor device according to claim 7, wherein said frequency f2 is changed and said power ratio is changed within the range represented by the formula (C).

9. A process for producing a semiconductor device having a plurality of layers and a substrate, comprising:

installing the substrate in a reactor which can be evacuated;

introducing a gas into the reactor;

synthesizing a plurality of high frequency powers to obtain a synthesized power;

decomposing the introduced gas with the synthesized power applied to an electrode to generate a glow discharge; and depositing at least one layer at the substrate, wherein each of the plurality of high frequency powers has a different frequency, and the frequency of at least one of the plurality of high frequency powers is changed during the depositing step.

10. A process for producing a semiconductor device having a plurality of layers and a substrate, comprising:

installing the substrate in a reactor which can be evacuated;

introducing a gas into the reactor;

synthesizing a first high frequency power having a frequency f1 and a second high frequency power having a frequency power f2 to obtain a synthesized power of said first and second high frequency powers;

decomposing the introduced gas with the synthesized power of said first and second high frequency powers applied to an electrode to generate a glow discharge;

depositing a first layer at the substrate;

synthesizing a third high frequency power having a frequency f3 and a fourth high frequency power having a frequency f4 to obtain a synthesized power of said third and fourth high frequency powers;

introducing another gas into the reactor;

decomposing the other introduced gas with the synthesized power of said third and fourth high frequency powers applied to the electrode to generate a glow discharge; and depositing a second layer at the substrate, wherein at least one of said frequencies f1 and f2 is different from both of said frequencies f3 and f4.

11. The process for producing a semiconductor device according to claim 9, wherein at least one of said plurality of layers is formed while changing a frequency ratio and a power ratio of at least two of the plurality of high frequency powers.

12. The process for producing a semiconductor device according to claim 10, wherein a frequency ratio and a power ratio of said first and second high frequency powers is different from a frequency ratio and a power ratio of said third and fourth high frequency powers.

13. The process for producing a semiconductor device according to claim 9, wherein said semiconductor device is an electrophotographic photosensitive member having, on the substrate, said plurality of layers, and wherein said plurality of layers are made of a non-single-crystal material primarily made of silicon atoms and containing hydrogen atoms and/or halogen atoms.

14. The plasma processing method according to claim 1, wherein said plasma processing is formation of a deposition film.

15. The plasma processing method according to claim 1, wherein said plasma processing is etching.

16. The plasma processing method according to claim 1, wherein the electrode is provided in the reactor.

17. The method for manufacturing a semiconductor device according to claim 5, wherein the electrode is provided in the reactor.

18. The plasma processing method according to claim 1, wherein the reactor has plural electrodes.

19. The method for manufacturing a semiconductor device according to claim 5, wherein the reactor has plural electrodes.

* * * * *

UNITED STATES PATENT AND TRADEMARK OFFICE
CERTIFICATE OF CORRECTION

PATENT NO. : 6,849,123 B2
DATED : February 1, 2005
INVENTOR(S) : Hiroaki Niino et al.

It is certified that error appears in the above-identified patent and that said Letters Patent is hereby corrected as shown below:

Column 2,
Line 11, "opened" should read -- opened. --.

Column 7,
Line 49, "attain an" should read -- attain a --.

Column 11,
Line 3, "attained on" should read -- attained. ¶ On --;
Line 38, "processing" should read -- processing. --; and
Line 46, "nitrding" should read -- nitriding --.

Column 12,
Line 34, "Into" should read -- into --.

Column 16,
Line 53, "lamps" should read -- lamp, --; and
Line 67, "are heated" should read -- is heated --.

Column 18,
Line 44, "that can" should read -- that can be --.

Column 19,
Line 36, "introducing" should read -- introduce --; and
Line 43, "can" should read -- can be --.

Column 20,
Line 63, "an uniform" should read -- a uniform --.

Column 21,
Line 47, "compensates" should read -- compensate --; and
Line 48, "is effective" should read -- are effective --.

Column 22,
Line 28, "Is" should read -- is --.

Column 23,
Line 46, "is significantly" should read -- are significantly --.

Column 26,
Lines 12 and 49, "an uniform" should read -- a uniform --.

UNITED STATES PATENT AND TRADEMARK OFFICE
CERTIFICATE OF CORRECTION

PATENT NO. : 6,849,123 B2
DATED : February 1, 2005
INVENTOR(S) : Hiroaki Niino et al.

It is certified that error appears in the above-identified patent and that said Letters Patent is hereby corrected as shown below:

Column 27,
Line 42, "invention" should read -- invention. --; and
Line 47, "layer The" should read -- layer. The --.

Column 28,
Line 34, "$Bi_2O_2$," should read -- $Bi_2O_3$, --; and
Line 66, "falls" should read -- fall --.

Column 29,
Line 25, "a-SiC; H," should read -- a-SiC: H, --.

Column 33,
Line 26, "photoconductive, layer, an Intermediate" should read -- photoconductive layer, an intermediate --.

Column 41,
Line 6, "occur," should read -- occurs, --; and
Line 29, "example:" should read -- example; --.

Column 43,
Line 43, "constant" should read -- constant. --; and
Table 12, "$PH_7/H_2$" should read -- $PH_3/H_2$ --.

Column 44,
Line 17, "Total power;" should read -- Total power: --.

Signed and Sealed this

Twenty-fourth Day of January, 2006

JON W. DUDAS
*Director of the United States Patent and Trademark Office*